United States Patent
Tung et al.

(10) Patent No.: US 11,056,459 B2
(45) Date of Patent: Jul. 6, 2021

(54) CHIP PACKAGE STRUCTURE AND METHOD FOR FORMING THE SAME

(71) Applicant: Taiwan Semiconductor Manufacturing Co., Ltd., Hsinchu (TW)

(72) Inventors: Chih-Hang Tung, Hsinchu (TW); Tung-Liang Shao, Hsinchu (TW); Su-Chun Yang, Hsinchu County (TW); Geng-Ming Chang, Taichung (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/373,900

(22) Filed: Apr. 3, 2019

(65) Prior Publication Data
US 2020/0058614 A1   Feb. 20, 2020

Related U.S. Application Data

(60) Provisional application No. 62/718,799, filed on Aug. 14, 2018.

(51) Int. Cl.
*H01L 23/00* (2006.01)

(52) U.S. Cl.
CPC .............. *H01L 24/80* (2013.01); *H01L 24/08* (2013.01); *H01L 24/24* (2013.01); *H01L 2224/02331* (2013.01); *H01L 2224/02381* (2013.01); *H01L 2224/24105* (2013.01); *H01L 2224/24147* (2013.01); *H01L 2224/80004* (2013.01); *H01L 2224/80143* (2013.01); *H01L 2224/80895* (2013.01); *H01L 2224/80896* (2013.01)

(58) Field of Classification Search
CPC .............. H01L 24/08; H01L 2224/8895; H01L 2224/04026; H01L 2224/04105
See application file for complete search history.

(56) References Cited

U.S. PATENT DOCUMENTS

| | | | |
|---|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

A method for forming a chip package structure is provided. The method includes partially removing a first redistribution layer to form an alignment trench in the first redistribution layer. The alignment trench surrounds a bonding portion of the first redistribution layer. The method includes forming a liquid layer over the bonding portion. The method includes disposing a chip structure over the liquid layer, wherein a first width of the bonding portion is substantially equal to a second width of the chip structure. The method includes evaporating the liquid layer. The chip structure is in direct contact with the bonding portion after the liquid layer is evaporated.

20 Claims, 20 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 2014/0264811 A1* | 9/2014 | Wu .................. H01L 25/50 |
| | | 257/686 |
| 2018/0068921 A1* | 3/2018 | Wang ................ H01L 24/24 |

* cited by examiner

CHIP PACKAGE STRUCTURE AND METHOD FOR FORMING THE SAME

PRIORITY CLAIM AND CROSS-REFERENCE

This Application claims the benefit of U.S. Provisional Application No. 62/718,799, filed on Aug. 14, 2018, and entitled "STRUCTURE AND FORMATION METHOD OF CHIP PACKAGE", the entirety of which is incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that takes up less area or has a lower height, in some applications.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1E-1 is a top view of the chip package structure of FIG. 1E, in accordance with some embodiments.

FIG. 1G-1 is a top view of the chip package structure of FIG. 1G, in accordance with some embodiments.

DETAILED DESCRIPTION

Figure 1A:
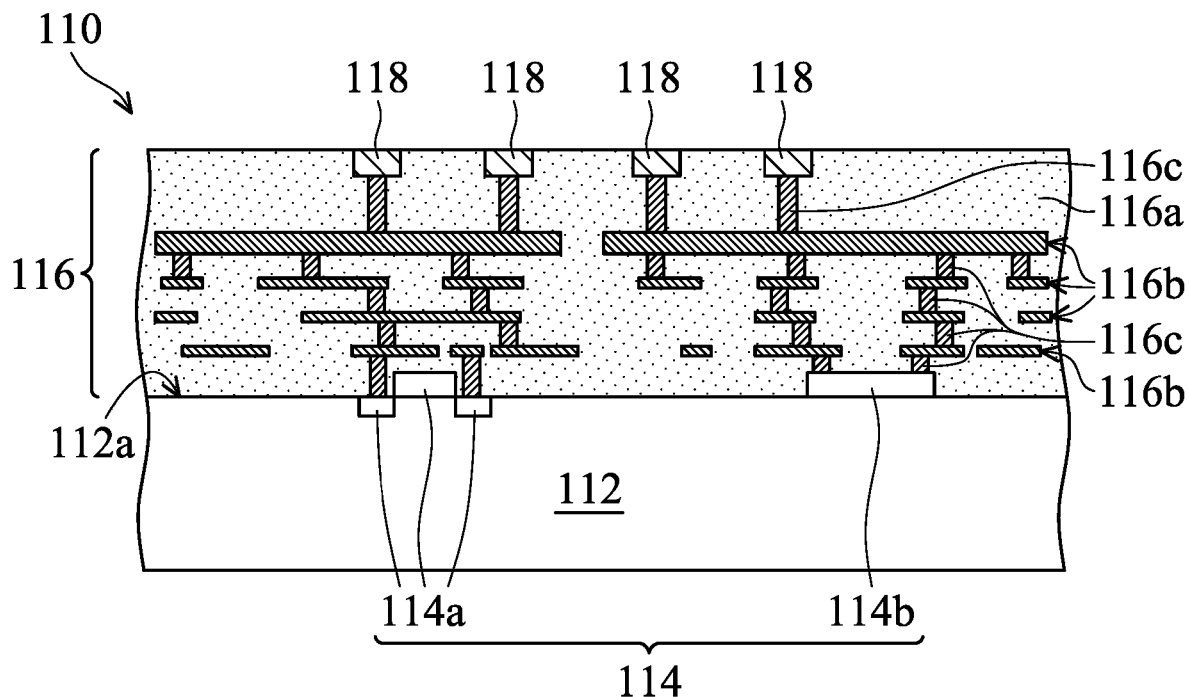
FIGS. 1A-1M are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1M are cross-sectional views of various stages of a process for forming a chip package structure, in accordance with some embodiments. As shown in FIG. 1A, a substrate 110 is provided, in accordance with some embodiments. In some embodiments, the substrate 110 is a wafer. The substrate 110 is also referred to as a carrier substrate, in accordance with some embodiments. The substrate 110 includes a semiconductor structure 112, devices 114, a redistribution layer 116, and conductive pads 118, in accordance with some embodiments.

The semiconductor structure 112 has a surface 112a, in accordance with some embodiments. In some embodiments, the semiconductor structure 112 is made of an elementary semiconductor material including silicon or germanium in a single crystal, polycrystal, or amorphous structure.

In some other embodiments, the semiconductor structure 112 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor structure 112 may also include multi-layer semiconductors, semiconductor on insulator (SOI) (such as silicon on insulator or germanium on insulator), or a combination thereof.

The devices 114 include active devices 114a and/or passive devices 114b, in accordance with some embodiments. The active devices 114a may include transistors formed at the surface 112a. The passive devices 114b are formed in or over the semiconductor structure 112, in accordance with some embodiments. The passive devices 114b include resistors, capacitors, or other suitable passive devices.

The redistribution layer 116 is formed over the semiconductor structure 112 and the devices 114, in accordance with some embodiments. The conductive pads 118 are formed over the redistribution layer 116, in accordance with some embodiments. The redistribution layer 116 includes a dielectric layer 116a, wiring layers 116b, and conductive vias 116c, in accordance with some embodiments. The dielectric layer 116a is formed over the surface 112a, in accordance with some embodiments. The wiring layers 116b are formed in the dielectric layer 116a, in accordance with some embodiments.

As shown in FIG. 1A, the conductive vias 116c are electrically connected between different wiring layers 116b and between the wiring layer 116b and the conductive pads 118, in accordance with some embodiments. The devices 114 are electrically connected to the conductive pads 118 through the wiring layers 116b and the conductive vias 116c, in accordance with some embodiments.

The dielectric layer 116a is made of an oxide-containing material (e.g. silicon oxide) or another suitable insulating material, in accordance with some embodiments. The wiring layers 116b, the conductive vias 116c, and the conductive pads 118 are made of a conductive material such as metal (e.g., aluminum, copper or tungsten) or alloy, in accordance with some embodiments.

Figure 1B:
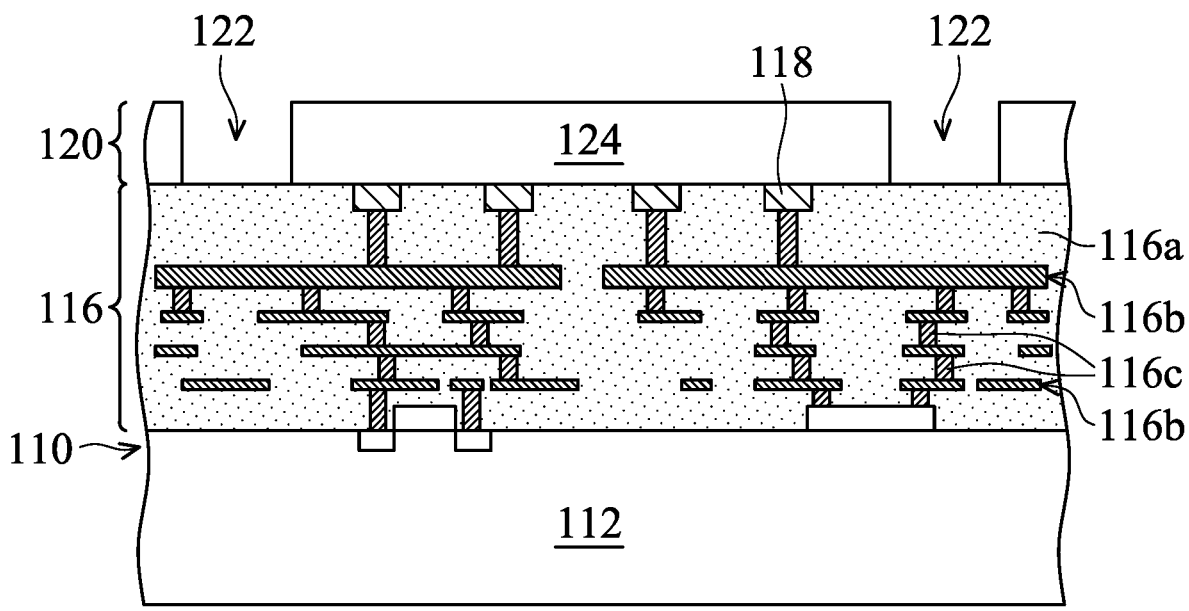

As shown in FIG. 1B, a mask layer 120 is formed over the redistribution layer 116, in accordance with some embodiments. The mask layer 120 covers the conductive pads 118, in accordance with some embodiments. The mask layer 120 has a trench 122, in accordance with some embodiments. The trench 122 passes through the mask layer 120 and exposes the redistribution layer 116 thereunder, in accordance with some embodiments.

The trench 122 exposes the dielectric layer 116a thereunder, in accordance with some embodiments. The trench 122 has a ring shape, in accordance with some embodiments. The trench 122 continuously surrounds a portion 124 of the mask layer 120, in accordance with some embodiments. The mask layer 120 is made of a polymer material, such as a photoresist material, in accordance with some embodiments. The mask layer 120 is formed using a coating process and a photolithography process, in accordance with some embodiments.

Figure 1C:
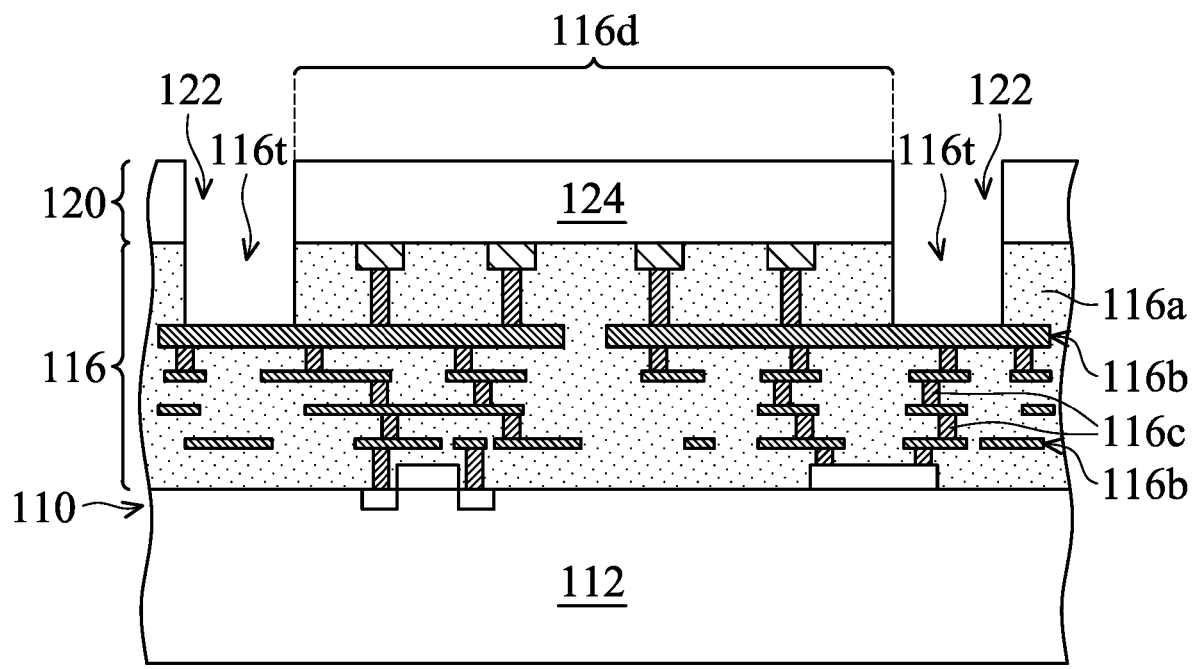

As shown in FIG. 1C, a portion of the dielectric layer 116a is removed through the trench 122, in accordance with some embodiments. The removal process forms an alignment trench 116t in the dielectric layer 116a, in accordance with some embodiments. The alignment trench 116t surrounds a bonding portion 116d of the redistribution layer 116, in accordance with some embodiments.

The alignment trench 116t continuously surrounds the entire bonding portion 116d, in accordance with some embodiments. The alignment trench 116t partially exposes the wiring layers 116b, in accordance with some embodiments. The removal process includes an etching process such as a dry etching process, in accordance with some embodiments.

Figure 1D:
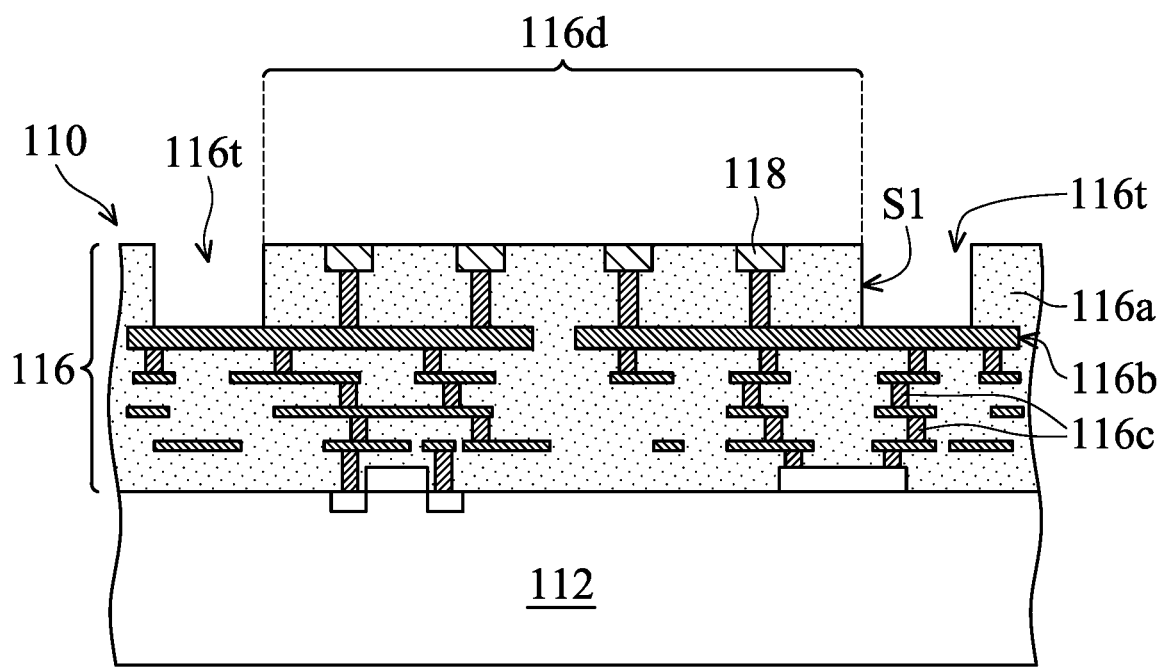

As shown in FIG. 1D, the mask layer 120 is removed, in accordance with some embodiments. The removal process includes an etching process, in accordance with some embodiments. The sidewall S1 of the bonding portion 116d forms the inner wall of the alignment trench 116t, in accordance with some embodiments.

Figure 1E:
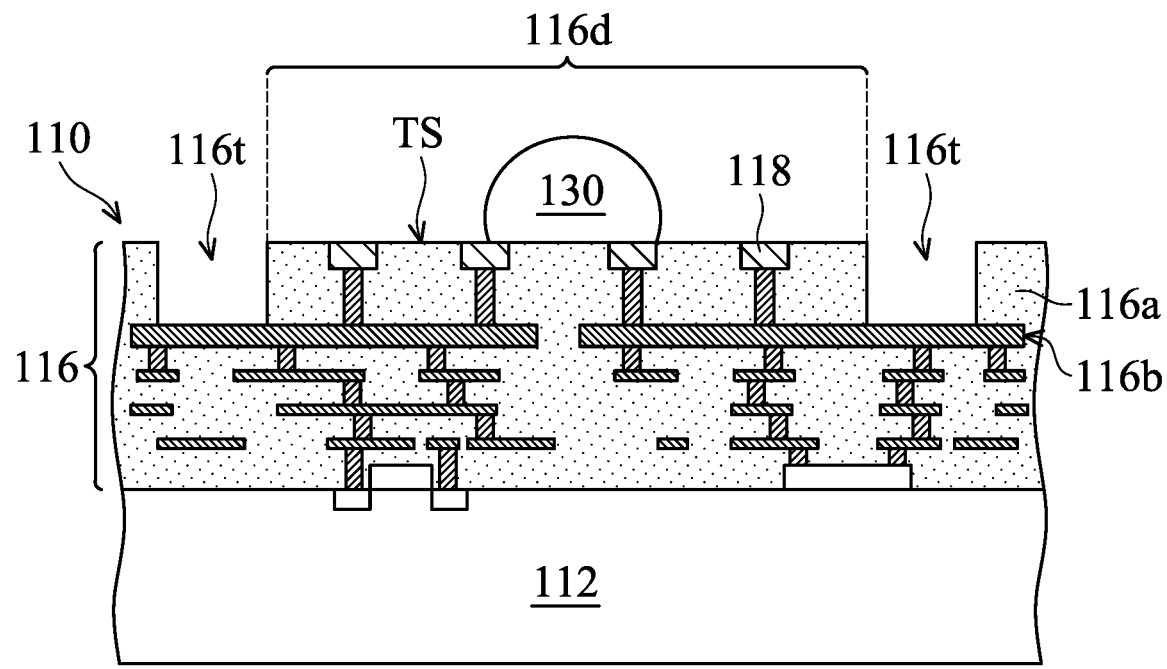
Figures 1, 1E:
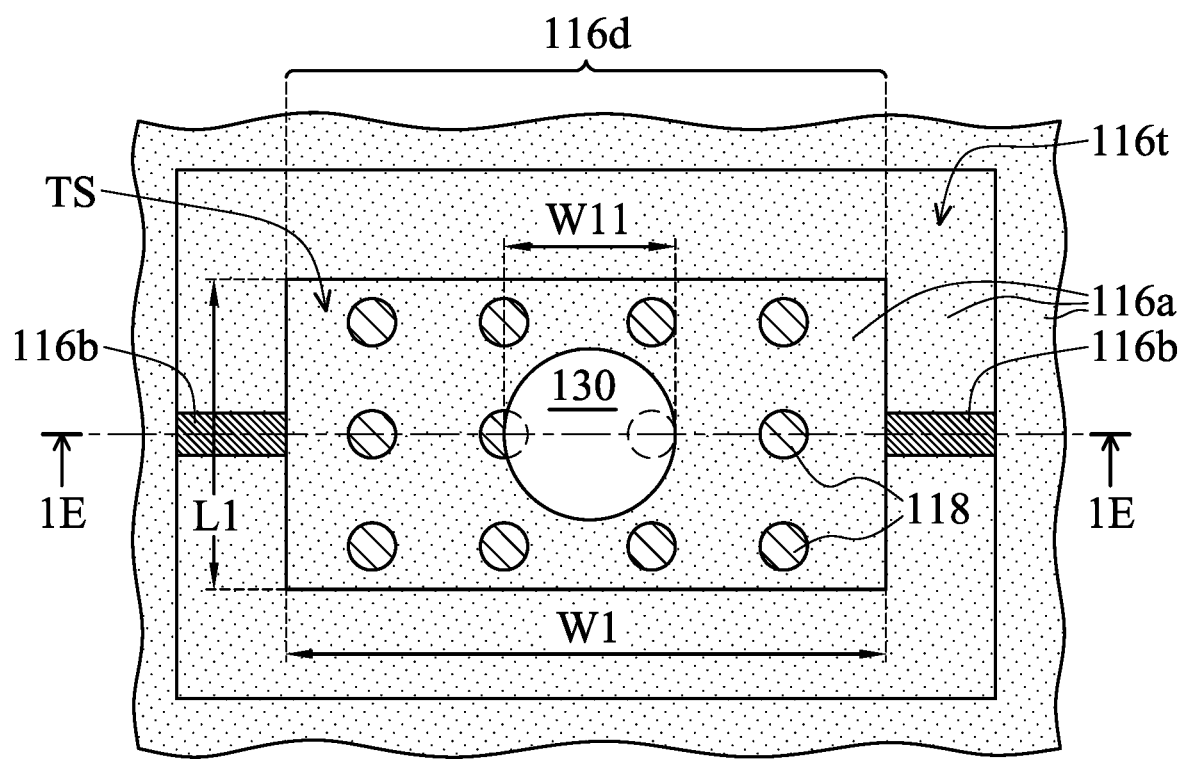

FIG. 1E-1 is a top view of the chip package structure of FIG. 1E, in accordance with some embodiments. FIG. 1E is a cross-sectional view illustrating the chip package structure along a sectional line 1E-1E in FIG. 1E-1, in accordance with some embodiments.

As shown in FIGS. 1E and 1E-1, a liquid layer 130 is formed over the bonding portion 116d, in accordance with some embodiments. The liquid layer 130 is formed by dispensing a drop of a liquid (or drops of a liquid) over the bonding portion 116d, in accordance with some embodiments. The alignment trench 116t continuously surrounds the entire bonding portion 116d and the liquid layer 130, in accordance with some embodiments.

The liquid layer 130 is not formed in the alignment trench 116t, in accordance with some embodiments. The liquid layer 130 is made of water, in accordance with some embodiments. In some other embodiments, the liquid layer 130 is made of alcohol, propyl alcohol, or another suitable liquid having good volatility and good surface tension.

The bonding portion 116d has a width W1 and a length L1, in accordance with some embodiments. The width W1 ranges from about 3000 µm to about 7000 µm, in accordance with some embodiments. The length L1 ranges from about 3000 µm to about 7000 µm, in accordance with some embodiments.

The bonding portion 116d has a top surface TS, in accordance with some embodiments. In some embodiments, a ratio of the volume of the liquid layer 130 to a surface area of the top surface TS ranges from about 1 µL/cm$^2$ to about 40 µL/cm$^2$. In some embodiments, the ratio of the volume of the liquid layer 130 to the surface area of the top surface TS ranges from about 2 µL/cm$^2$ to about 20 µL/cm$^2$. The liquid layer 130 has a width W11, in accordance with some embodiments. In some embodiments, a ratio of the width W11 to the width W1 ranges from about 0.1 to about 0.5. In some embodiments, the ratio of the width W11 to the width W1 ranges from about 0.2 to about 0.25.

Figure 1F:
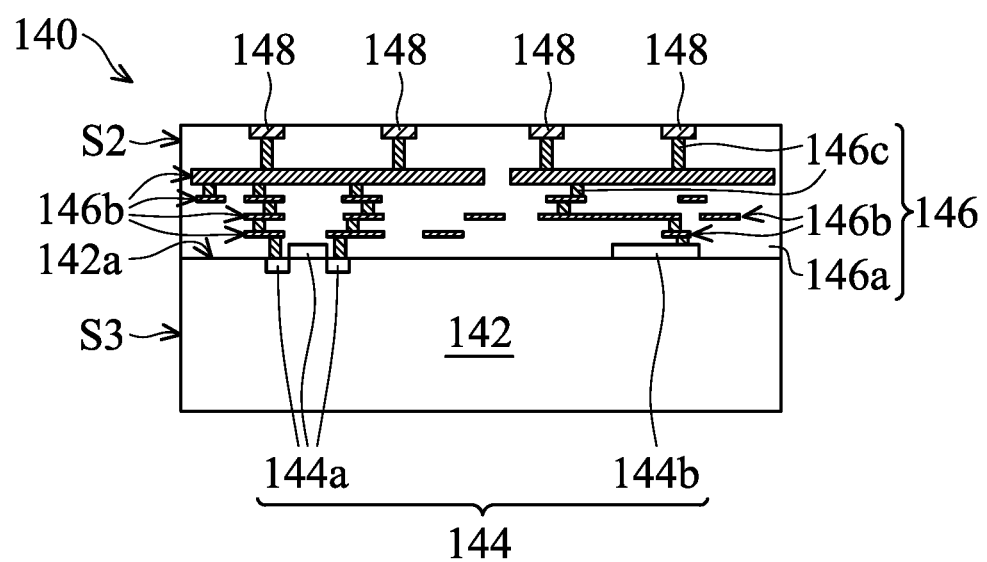

As shown in FIG. 1F, a chip structure 140 is provided, in accordance with some embodiments. The chip structure 140 includes a semiconductor structure 142, devices 144, a redistribution layer 146, and conductive pads 148, in accordance with some embodiments. The semiconductor structure 142 has a surface 142a, in accordance with some embodiments. In some embodiments, the semiconductor structure 142 is made of an elementary semiconductor material including silicon or germanium in a single crystal, polycrystal, or amorphous structure.

In some other embodiments, the semiconductor structure 142 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor structure 142 may also include multi-layer semiconductors, semiconductor on insulator (SOI) (such as silicon on insulator or germanium on insulator), or a combination thereof.

The devices 144 include active devices 144a and/or passive devices 144b, in accordance with some embodiments. The active devices 144*a* may include transistors formed at the surface 142*a*. The passive devices 144*b* are formed in or over the semiconductor structure 142, in accordance with some embodiments. The passive devices 144*b* include resistors, capacitors, or other suitable passive devices.

The redistribution layer 146 is formed over the semiconductor structure 142 and the devices 144, in accordance with some embodiments. The conductive pads 148 are formed over the redistribution layer 146, in accordance with some embodiments. The chip structure 140 is formed by performing a cutting process over a wafer to cut the wafer into chip structures 140, in accordance with some embodiments. The cutting process includes a plasma etching process or a stealth dicing process, in accordance with some embodiments. In some embodiments, a sidewall S2 of the redistribution layer 146 and a sidewall S3 of the semiconductor structure 142 are substantially coplanar.

The redistribution layer 146 includes a dielectric layer 146*a*, wiring layers 146*b*, and conductive vias 146*c*, in accordance with some embodiments. The dielectric layer 146*a* is formed over the surface 142*a*, in accordance with some embodiments. The wiring layers 146*b* are formed in the dielectric layer 146*a*, in accordance with some embodiments.

The conductive vias 146*c* are electrically connected between different wiring layers 146*b* and between the wiring layer 146*b* and the conductive pads 148, in accordance with some embodiments. The devices 144 are electrically connected to the conductive pads 148 through the wiring layers 146*b* and the conductive vias 146*c*, in accordance with some embodiments.

The dielectric layer 146*a* is made of an oxide-containing material (e.g. silicon oxide) or another suitable insulating material, in accordance with some embodiments. The wiring layers 146*b*, the conductive vias 146*c*, and the conductive pads 148 are made of a conductive material such as metal (e.g., aluminum, copper or tungsten) or alloy, in accordance with some embodiments.

Figure 1G:
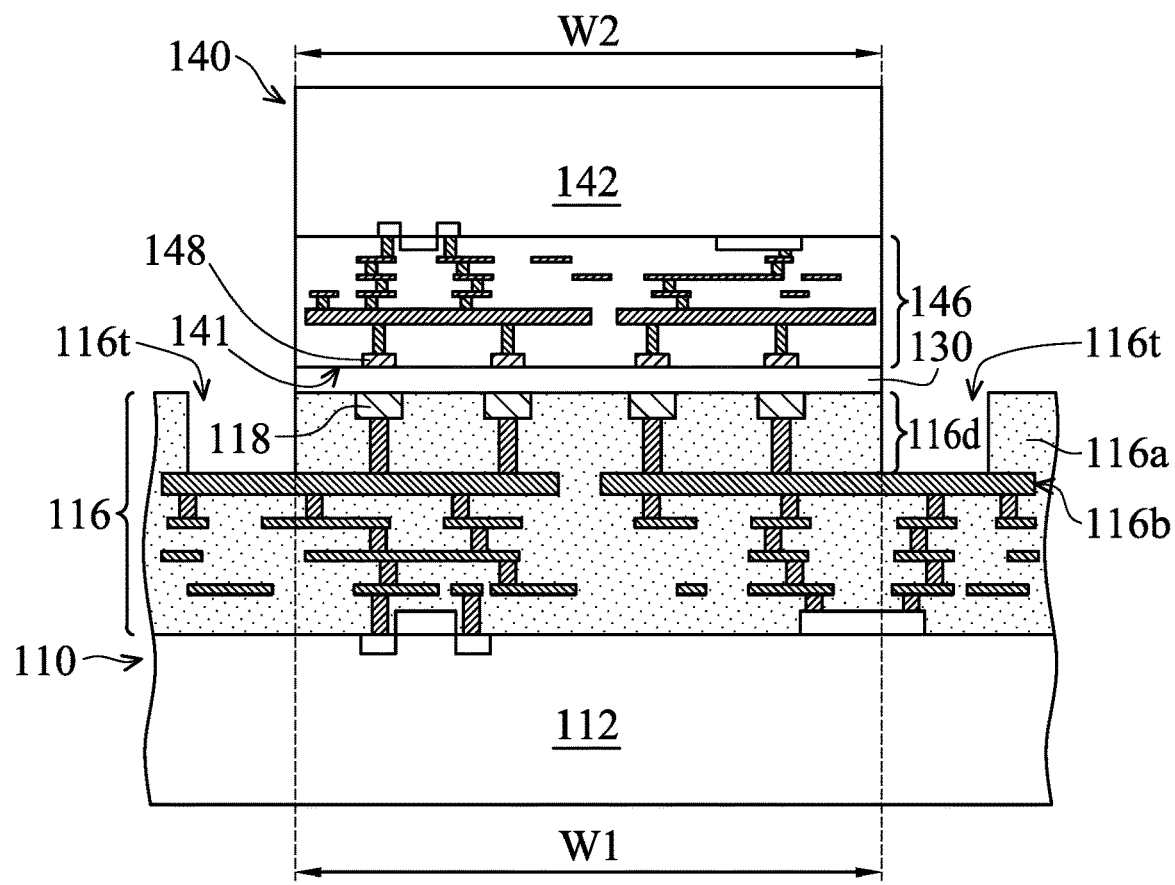
Figures 1, 1G:
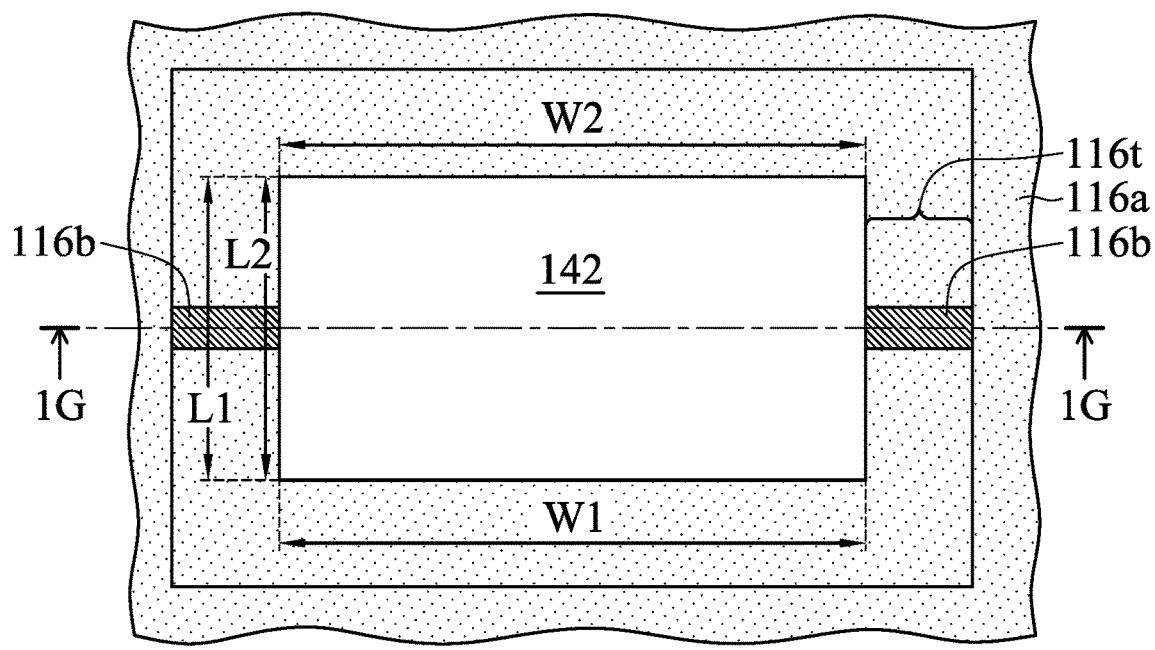

FIG. 1G-1 is a top view of the chip package structure of FIG. 1G, in accordance with some embodiments. FIG. 1G is a cross-sectional view illustrating the chip package structure along a sectional line 1G-1G in FIG. 1G-1, in accordance with some embodiments.

As shown in FIGS. 1G and 1G-1, the chip structure 140 is disposed on the liquid layer 130, in accordance with some embodiments. The redistribution layer 146 is between the semiconductor structure 142 and the liquid layer 130, in accordance with some embodiments. The redistribution layer 146 is between the semiconductor structure 142 and the bonding portion 116*d*, in accordance with some embodiments.

The surface tension of the liquid layer 130 helps the chip structure 140 to be aligned with the bonding portion 116*d*, in accordance with some embodiments. Therefore, the chip structure 140 is self-aligned with the bonding portion 116*d*, in accordance with some embodiments. As a result, the alignment accuracy between the chip structure 140 and the bonding portion 116*d* is greatly improved by the liquid layer 130, in accordance with some embodiments. Therefore, the yield is improved, and the process window can be greatly increased. As a result, the disposal process is able to be performed using a disposal apparatus with lower accuracy and higher throughput than disposal apparatuses with higher accuracy and lower throughput. Therefore, the throughput is improved.

The chip structure 140 has a bonding surface 141 facing the bonding portion 116*d*, in accordance with some embodiments. The bonding surface 141 is in direct contact with the liquid layer 130, in accordance with some embodiments. The bonding surface 141 (or the redistribution layer 146) and the bonding portion 116*d* have a same shape such as a rectangular shape, in accordance with some embodiments. The shape of the bonding surface 141 (or the redistribution layer 146) and the bonding portion 116*d* is a non-circular shape, and therefore the chip structure 140 is unable to spin freely over the liquid layer 130, in accordance with some embodiments. As a result, the non-circular shape helps the bonding surface 141 (or the redistribution layer 146) to be aligned with the bonding portion 116*d* through the liquid layer 130, in accordance with some embodiments.

In some embodiments, the width W1 of the bonding portion 116*d* is substantially equal to a width W2 of the chip structure 140. The term "substantially equal to" means the difference between the widths W1 and W2 is within 0.05% of the average between the widths W1 and W2, in accordance with some embodiments. The difference may be due to manufacturing processes. The width W2 ranges from about 3000 μm to about 7000 μm, in accordance with some embodiments.

In some embodiments, the length L1 of the bonding portion 116*d* is substantially equal to a length L2 of the chip structure 140. The term "substantially equal to" means the difference between the lengths L1 and L2 is within 0.05% of the average between the lengths L1 and L2, in accordance with some embodiments. The difference may be due to manufacturing processes. The length L2 ranges from about 3000 μm to about 7000 μm, in accordance with some embodiments.

Figure 1H:
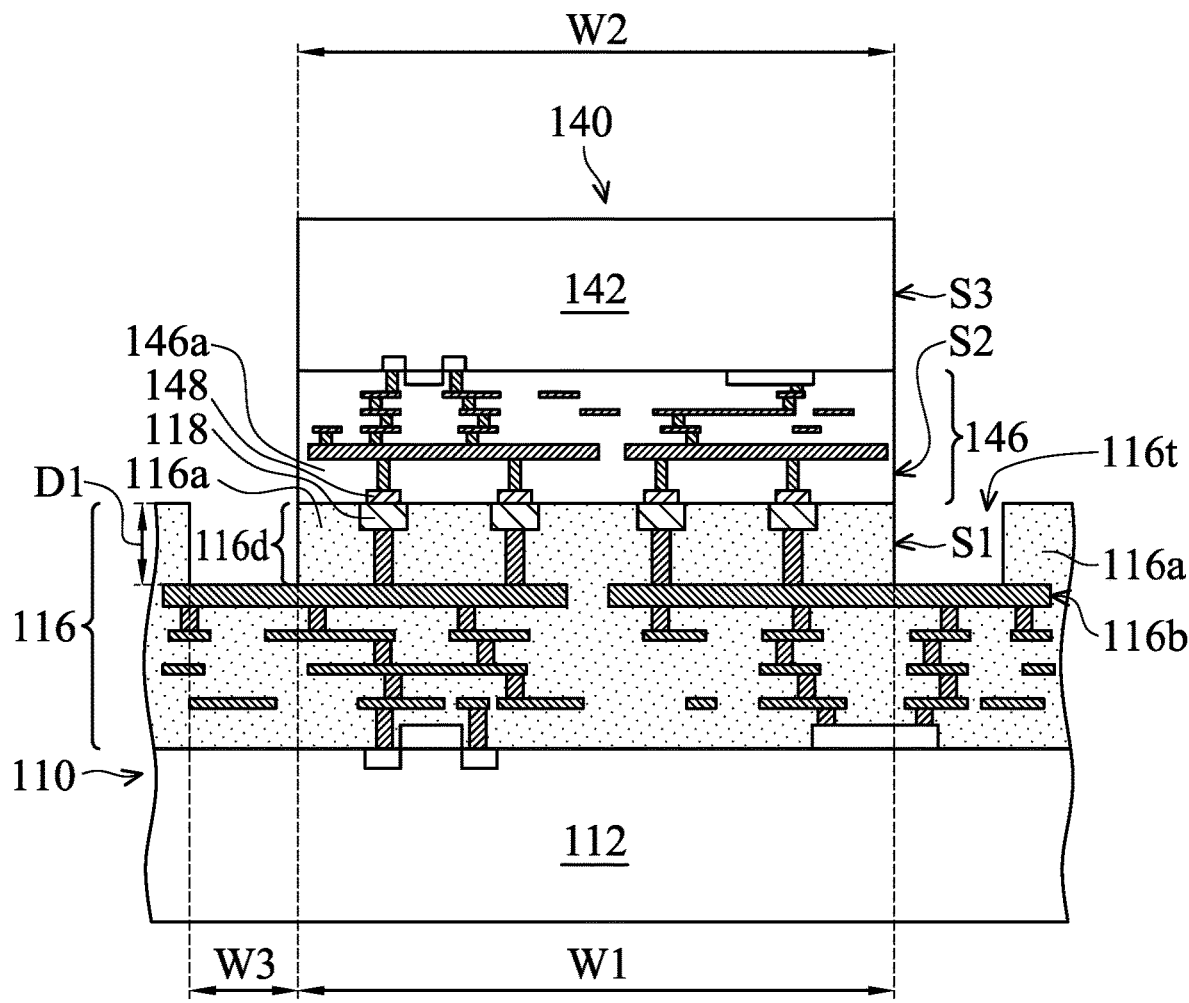

As shown in FIG. 1H, the liquid layer 130 is evaporated, in accordance with some embodiments. The chip structure 140 is in direct contact with and bonded to the bonding portion 116*d* after the liquid layer 130 is evaporated, in accordance with some embodiments. The redistribution layer 146 is in direct contact with the bonding portion 116*d*, in accordance with some embodiments.

In some embodiments, the sidewall S1 of the bonding portion 116*d* and a sidewall S2 of the redistribution layer 146 are substantially coplanar. In some embodiments, the sidewalls S1 and S2 and the sidewall S3 of the semiconductor structure 142 are substantially coplanar. The redistribution layer 146 has the width W2, which is substantially equal to the width W1 of the bonding portion 116*d*, in accordance with some embodiments.

The dielectric layer 146*a* of the chip structure 140 is in direct contact with and bonded to the dielectric layer 116*a* of the redistribution layer 116, in accordance with some embodiments. The conductive pads 148 are respectively and directly on the conductive pads 118, in accordance with some embodiments. The conductive pads 148 are in direct contact with and bonded to the conductive pads 118 respectively, in accordance with some embodiments.

The liquid layer 130 is evaporated at a room temperature, in accordance with some embodiments. After the liquid layer 130 is evaporated, an annealing process is performed at a temperature ranging from about 140° C. to about 200° C. for about 1 hour to about 5 hours to improve the bonding strength between the dielectric layers 116*a* and 146*a*, in accordance with some embodiments.

After the liquid layer 130 is evaporated, an annealing process is performed at a temperature ranging from about 170° C. to about 400° C. for about 50 minutes to about 2 hours to improve the bonding strength between the conductive pads 118 and 148, in accordance with some embodiments.

The alignment trench 116t has a width W3 and a depth D1, in accordance with some embodiments. The width W3 ranges from about 1 µm to about 100 µm, in accordance with some embodiments. The width W3 ranges from about 10 µm to about 100 µm, in accordance with some embodiments. The depth D1 ranges from about 0.5 µm to about 100 µm, in accordance with some embodiments. The depth D1 ranges from about 3 µm to about 100 µm, in accordance with some embodiments.

After the chip structure 140 is bonded to the bonding portion 116d, an electrical test may be performed over the chip structure 140. The electrical test is also referred to as a known good die (KGD) test, in accordance with some embodiments. If the chip structure 140 fails the electrical test, the chip structure 140 may be replaced by another chip structure (not shown). The chip structure (not shown) may be bonded to the bonding portion 116d by the steps of FIGS. 1G-1H, in accordance with some embodiments. The chip structure (not shown) has a structure the same as the chip structure 140, in accordance with some embodiments.

Figure 1I:
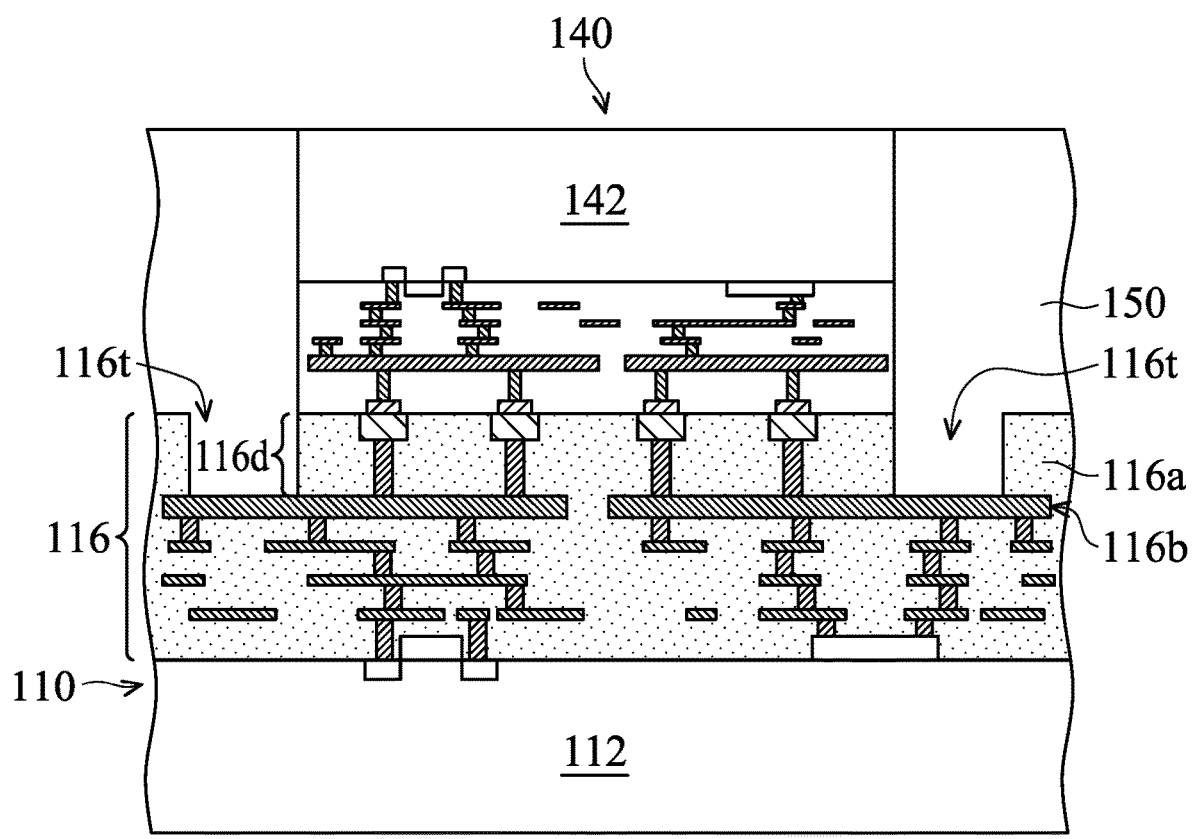

As shown in FIG. 1I, a protective layer 150 is formed over the redistribution layer 116 to surround the chip structure 140, in accordance with some embodiments. The alignment trench 116t is filled with the protective layer 150, in accordance with some embodiments. The protective layer 150 in the alignment trench 116t surrounds the bonding portion 116d, in accordance with some embodiments. The protective layer 150 is made of an insulating material such as an oxide-containing material (e.g., silicon oxide), in accordance with some embodiments.

Figure 1J:
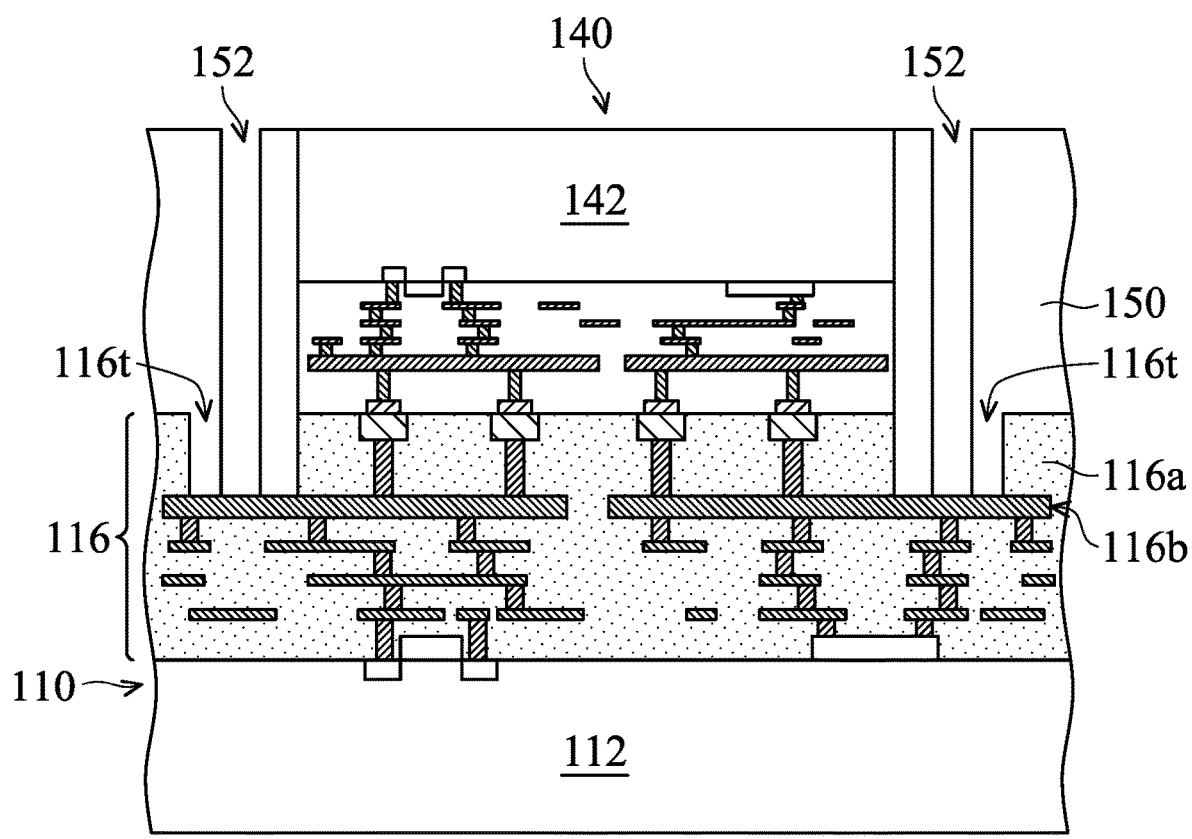

As shown in FIG. 1J, the protective layer 150 is partially removed to form through holes 152 in the protective layer 150, in accordance with some embodiments. The through holes 152 pass through the protective layer 150 and extend into the alignment trench 116t, in accordance with some embodiments. The through holes 152 partially expose the wiring layers 116b, in accordance with some embodiments. The removal process includes an etching process such as a dry etching process, in accordance with some embodiments.

Figure 1K:
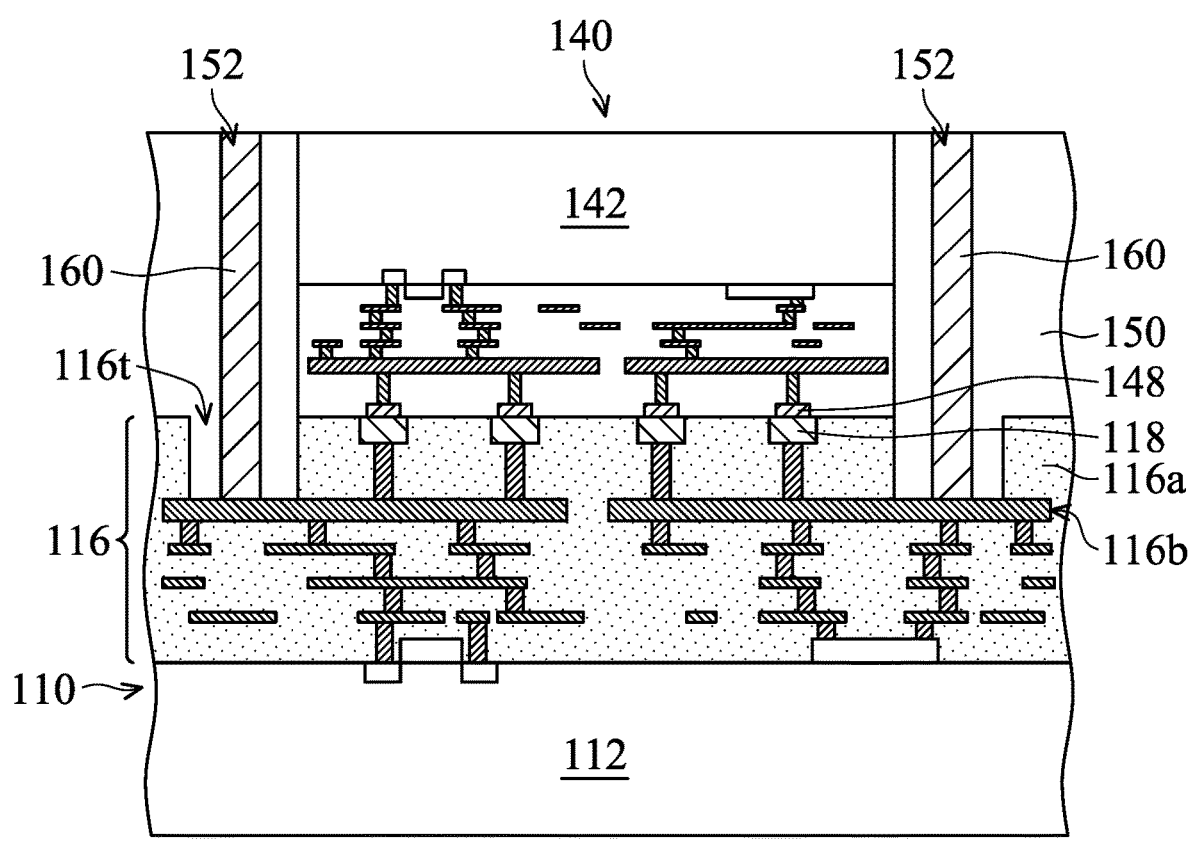

As shown in FIG. 1K, conductive via structures 160 are formed in the through holes 152, in accordance with some embodiments. The conductive via structures 160 pass through the protective layer 150, in accordance with some embodiments. The conductive via structures 160 are electrically connected to the wiring layers 116b of the redistribution layer 116, in accordance with some embodiments. The conductive via structures 160 pass through the portion of the protective layer 150 in the alignment trench 116t of the redistribution layer 116, in accordance with some embodiments.

Figure 1L:
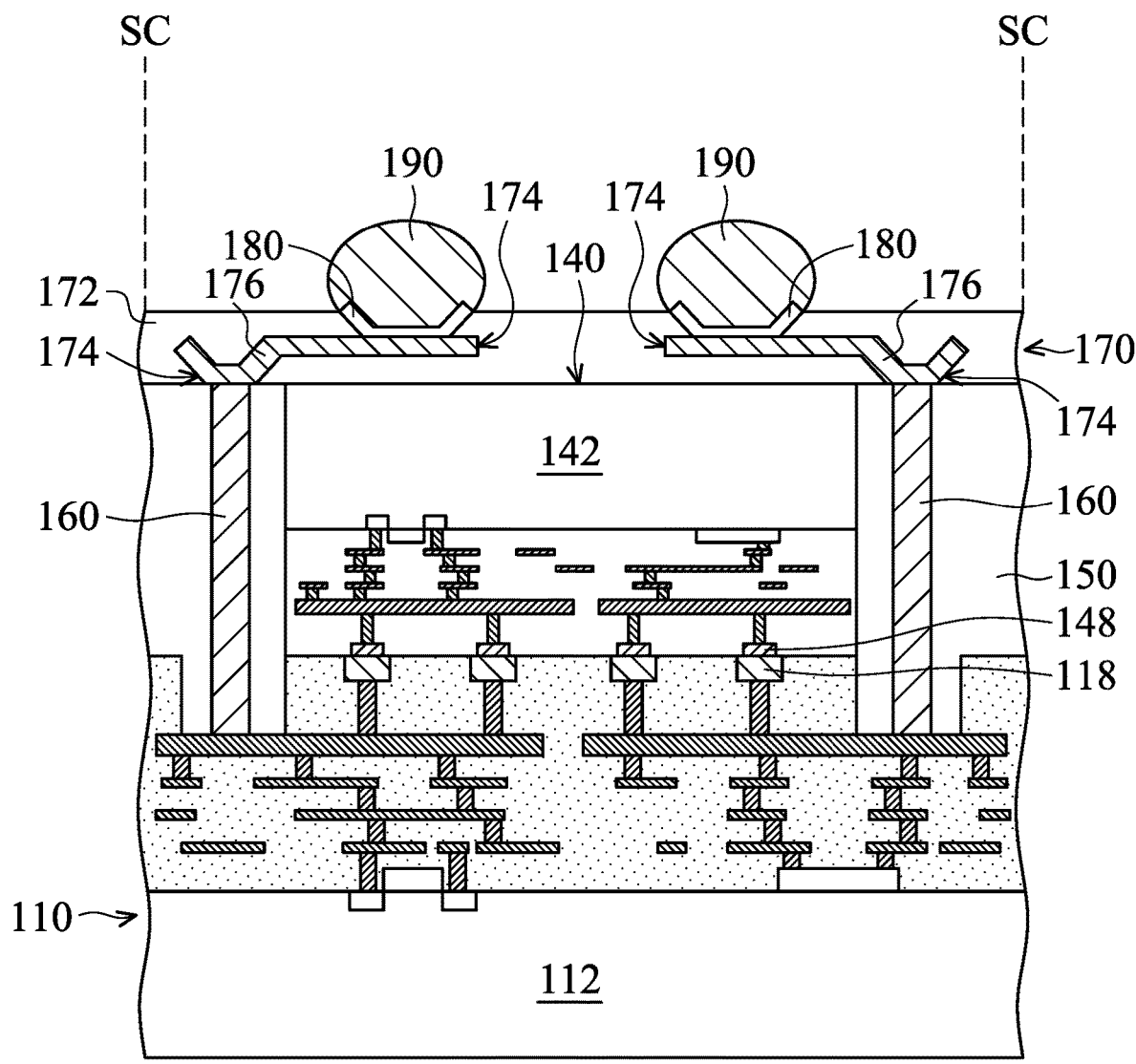

As shown in FIG. 1L, a redistribution layer 170 is formed over the chip structure 140, the protective layer 150, and the conductive via structures 160, in accordance with some embodiments. The redistribution layer 170 includes a dielectric layer 172, wiring layers 174, and conductive vias 176, in accordance with some embodiments. The wiring layers 174 are formed in the dielectric layer 172, in accordance with some embodiments.

The conductive vias 176 are electrically connected between different wiring layers 174, in accordance with some embodiments. The dielectric layer 172 is made of an oxide-containing material (e.g. silicon oxide) or another suitable insulating material, in accordance with some embodiments. The wiring layers 174 and the conductive vias 176 are made of a conductive material such as metal (e.g., aluminum, copper or tungsten) or alloy, in accordance with some embodiments.

As shown in FIG. 1L, conductive pads 180 are formed over the redistribution layer 170, in accordance with some embodiments. The conductive pads 180 are electrically connected to the wiring layers 174, in accordance with some embodiments. The conductive pads 180 are made of a conductive material such as metal (e.g., aluminum, copper or tungsten) or alloy, in accordance with some embodiments.

As shown in FIG. 1L, conductive bumps 190 are respectively formed over the conductive pads 180, in accordance with some embodiments. The conductive bumps 190 are made of a conductive material such as a solder material (e.g. tin), in accordance with some embodiments.

Figure 1M:
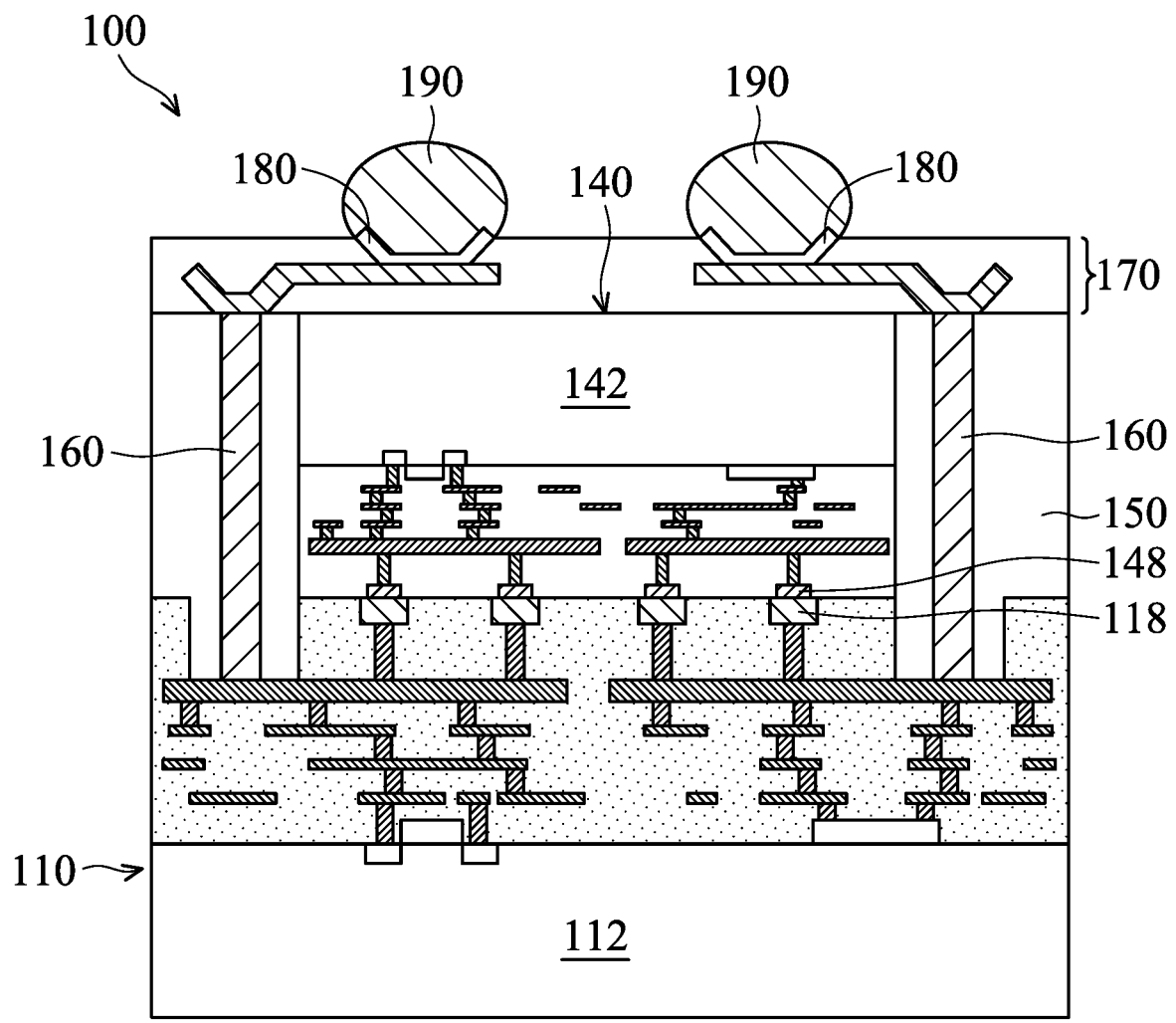

As shown in FIGS. 1L and 1M, a cutting process is performed to cut through the redistribution layer 170, the protective layer 150, and the substrate 110 along scribe lines SC so as to form chip package structures 100, in accordance with some embodiments. For the sake of simplicity, FIG. 1M only shows one of the chip package structures 100.

Figure 2:
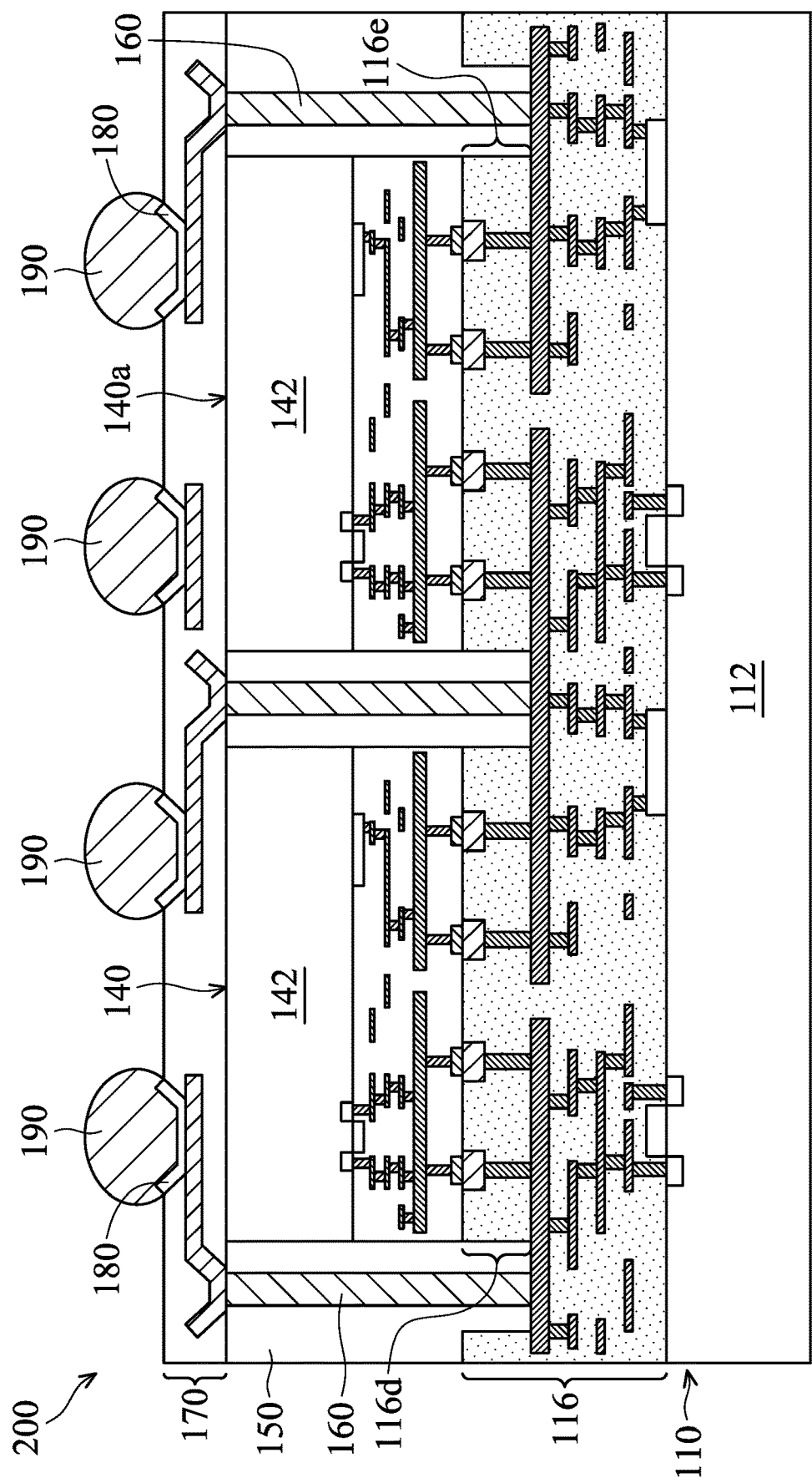
FIG. 2 is a cross-sectional view of a chip package structure 200, in accordance with some embodiments.

FIG. 2 is a cross-sectional view of a chip package structure 200, in accordance with some embodiments. As shown in FIG. 2, the chip package structure 200 is similar to the chip package structure 100 of FIG. 1M, except that the chip package structure 200 further includes a chip structure 140a and a bonding portion 116e of the redistribution layer 116, in accordance with some embodiments.

The chip structure 140a is bonded to the bonding portion 116e, in accordance with some embodiments. The chip structure 140a is the same as or similar to the chip structure 140, in accordance with some embodiments. The chip structures 140 and 140a have the same width or different widths. The bonding portion 116e is the same as or similar to the bonding portion 116d, in accordance with some embodiments. The bonding portions 116d and 116e have the same width or different widths.

Processes and materials for forming the chip package structure 200 may be similar to, or the same as, those for forming the chip package structure 100 described above.

Figure 3:
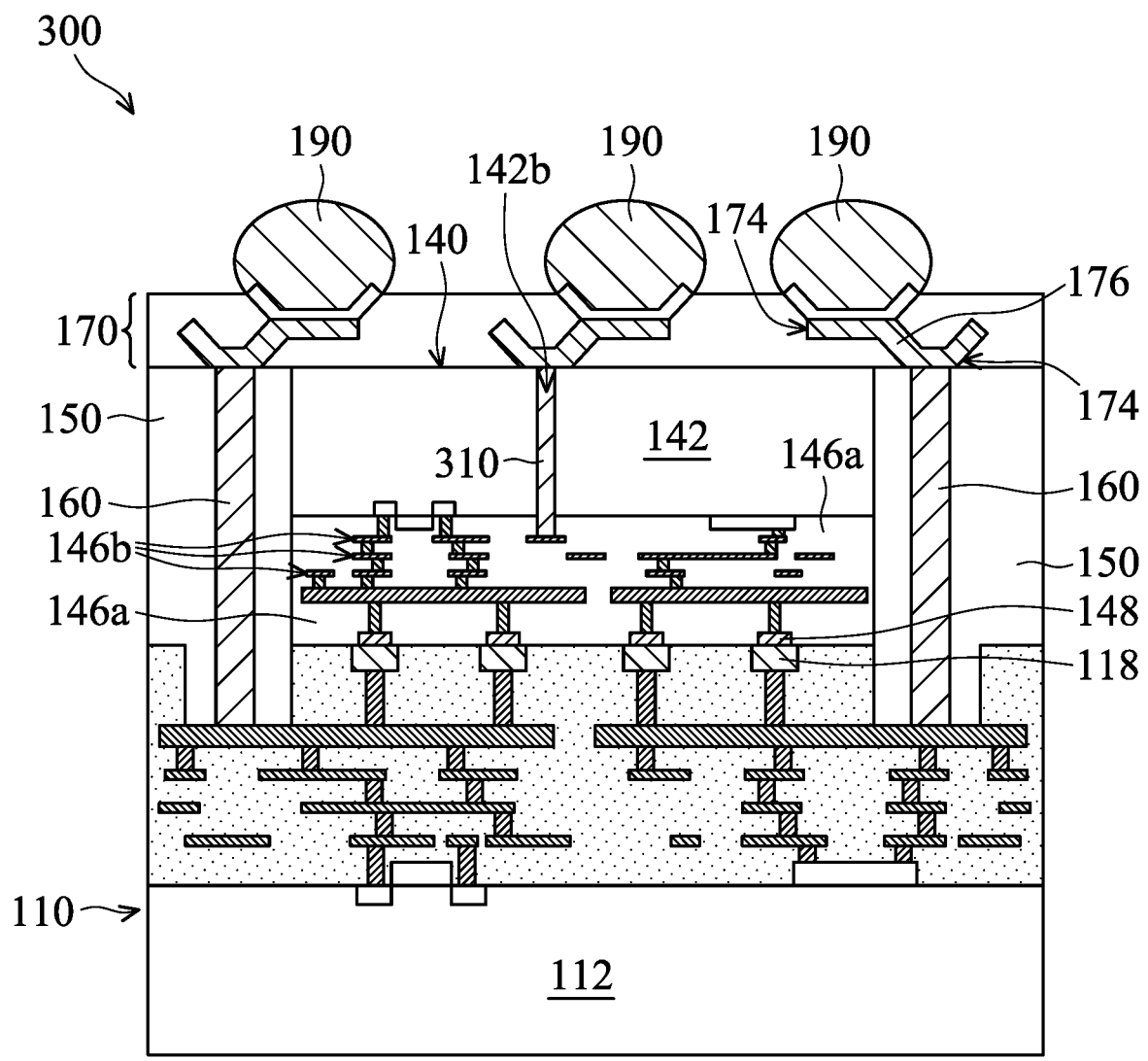
FIG. 3 is a cross-sectional view of a chip package structure 300, in accordance with some embodiments.

FIG. 3 is a cross-sectional view of a chip package structure 300, in accordance with some embodiments. As shown in FIG. 3, the chip package structure 300 is similar to the chip package structure 100 of FIG. 1M, except that the chip package structure 300 further includes a conductive via structure 310, in accordance with some embodiments.

The conductive via structure 310 passes through the semiconductor structure 142 and extends into the dielectric layer 146a to be electrically connected to the wiring layers 146b, in accordance with some embodiments. The conductive via structure 310 electrically connects the wiring layers 174 to the wiring layers 146b, in accordance with some embodiments.

The formation of the conductive via structure 310 includes: partially removing the semiconductor structure 142 and the dielectric layer 146a to form a through hole 142b in the semiconductor structure 142 and the dielectric layer 146a before forming the redistribution layer 170, wherein the through hole 142b passes through the semiconductor structure 142 and extends into the dielectric layer 146a; and forming the conductive via structure 310 in the through hole 142b, in accordance with some embodiments.

Processes and materials for forming the chip package structure 300 may be similar to, or the same as, those for forming the chip package structure 100 described above.

Figure 4:
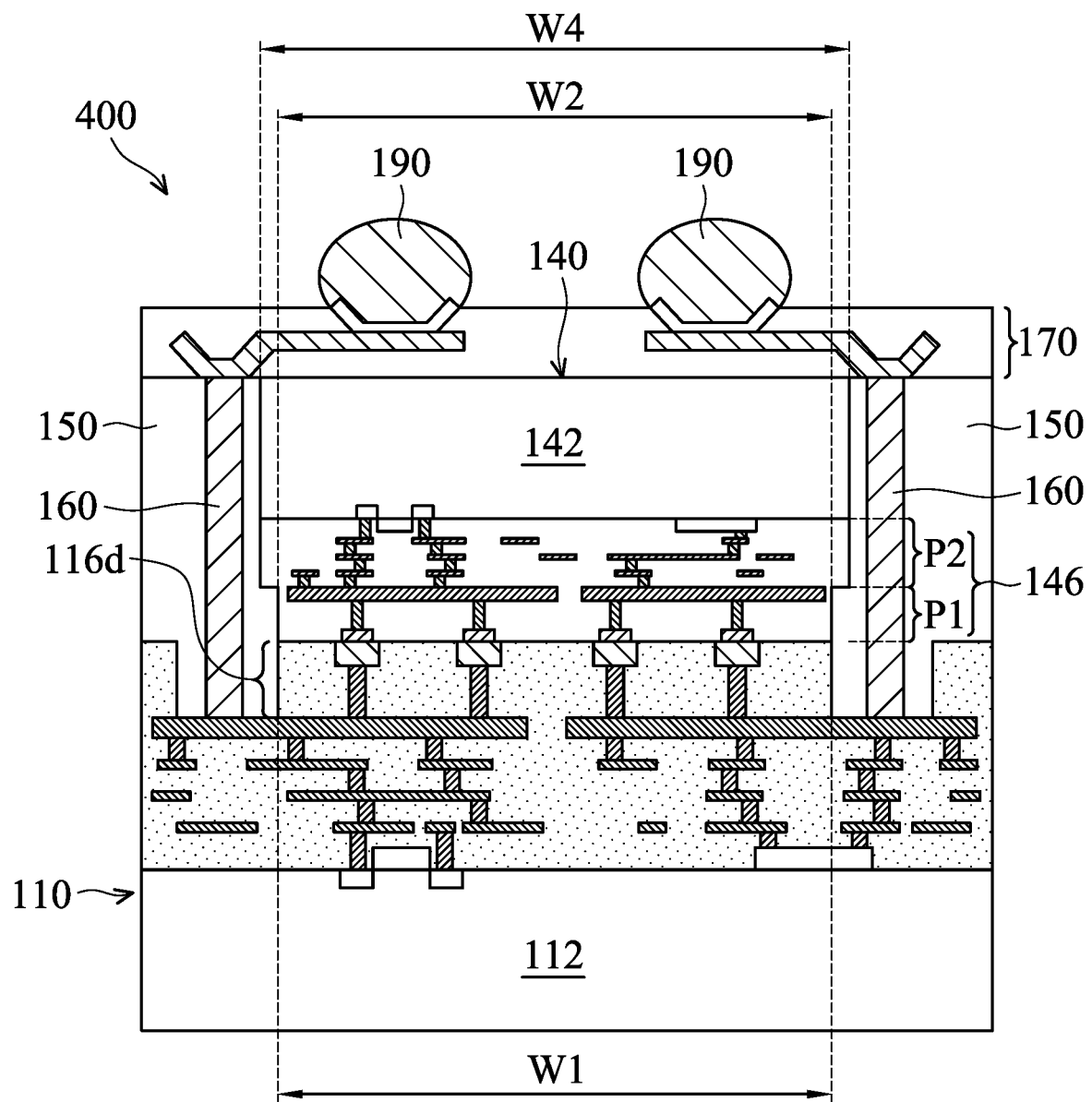
FIG. 4 is a cross-sectional view of a chip package structure 400, in accordance with some embodiments.

FIG. 4 is a cross-sectional view of a chip package structure 400, in accordance with some embodiments. As shown in FIG. 4, the chip package structure 400 is similar to the chip package structure 100 of FIG. 1M, except that the redistribution layer 146 of the chip structure 140 of the chip package structure 400 has a first portion P1 and a second portion P2, and the first portion P1 is narrower than the second portion P2, in accordance with some embodiments.

The second portion P2 is between the first portion P1 and the semiconductor structure 142, in accordance with some embodiments. The first portion P1 is in direct contact with the bonding portion 116d, in accordance with some embodiments. The first portion P1 is also referred to as a bonding portion, in accordance with some embodiments. The width W2 of the first portion P1 is substantially equal to the width W1 of the bonding portion 116d, in accordance with some embodiments.

The term "substantially equal to" means the difference between the widths W1 and W2 is within 0.05% of the average between the widths W1 and W2, in accordance with some embodiments. The difference may be due to manufacturing processes. The second portion P2 has a width W4, in accordance with some embodiments. The difference between the widths W2 and W4 ranges from about 1 μm to about 50 μm, in accordance with some embodiments. The difference between the widths W2 and W4 ranges from about 10 μm to about 30 μm, in accordance with some embodiments. The width W4 is greater than the width W1 or W2, in accordance with some embodiments.

The formation of the chip structure 140 includes: forming a redistribution layer over a wafer; performing a photolithography process and an etching process over the redistribution layer to form a trench in the redistribution layer, wherein the trench surrounds first portions of the redistribution layer, and a second portion of the redistribution layer is under the trench and the first portions; and performing a wafer dicing process (or a cutting process) to dice the wafer and the second portion along the trench, wherein the wafer and the second portion are diced into chip structures 140, in accordance with some embodiments. The wafer dicing process includes using an abrasive blade, in accordance with some embodiments. Compared with a wafer dicing process achieved by a plasma-etching process, a wafer dicing process achieved by using the abrasive blade has a lower process cost.

Since the first portion P1 is defined by photolithography and etching processes, which have higher process accuracy than that defined using the abrasive blade, the first portion P1 may have the width W2 precisely equal to the width W1 of the bonding portion 116d, in accordance with some embodiments.

Processes and materials for forming the chip package structure 400 may be similar to, or the same as, those for forming the chip package structure 100 described above.

Figure 5:
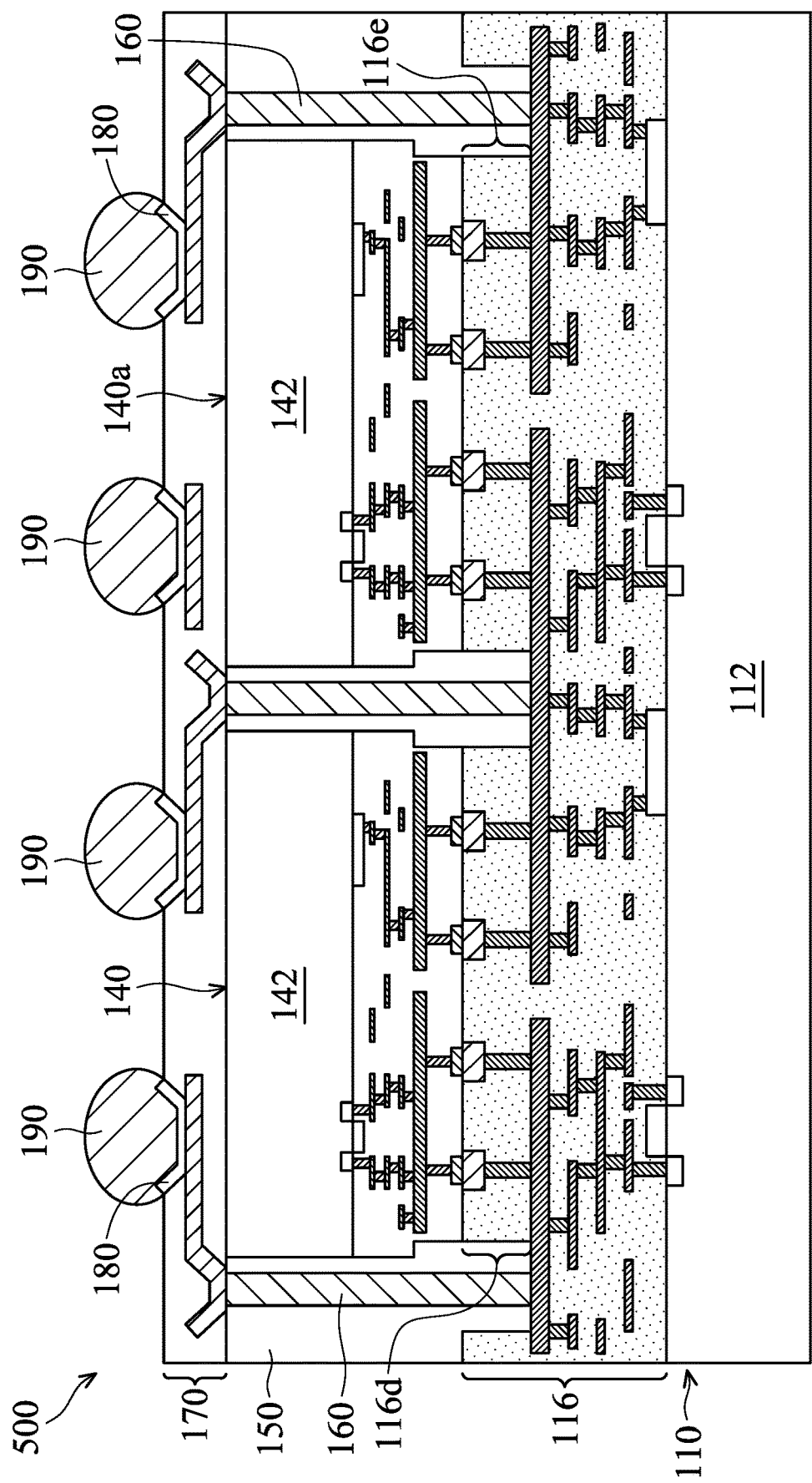
FIG. 5 is a cross-sectional view of a chip package structure, in accordance with some embodiments.

FIG. 5 is a cross-sectional view of a chip package structure 500, in accordance with some embodiments. As shown in FIG. 5, the chip package structure 500 is similar to the chip package structure 400 of FIG. 4, except that the chip package structure 500 further includes a chip structure 140a and a bonding portion 116e of the redistribution layer 116, in accordance with some embodiments.

The chip structure 140a is bonded to the bonding portion 116e, in accordance with some embodiments. The chip structure 140a is the same as or similar to the chip structure 140, in accordance with some embodiments. The bonding portion 116e is the same as or similar to the bonding portion 116d, in accordance with some embodiments.

Processes and materials for forming the chip package structure 500 may be similar to, or the same as, those for forming the chip package structures 100 and 400 described above.

Figure 6:
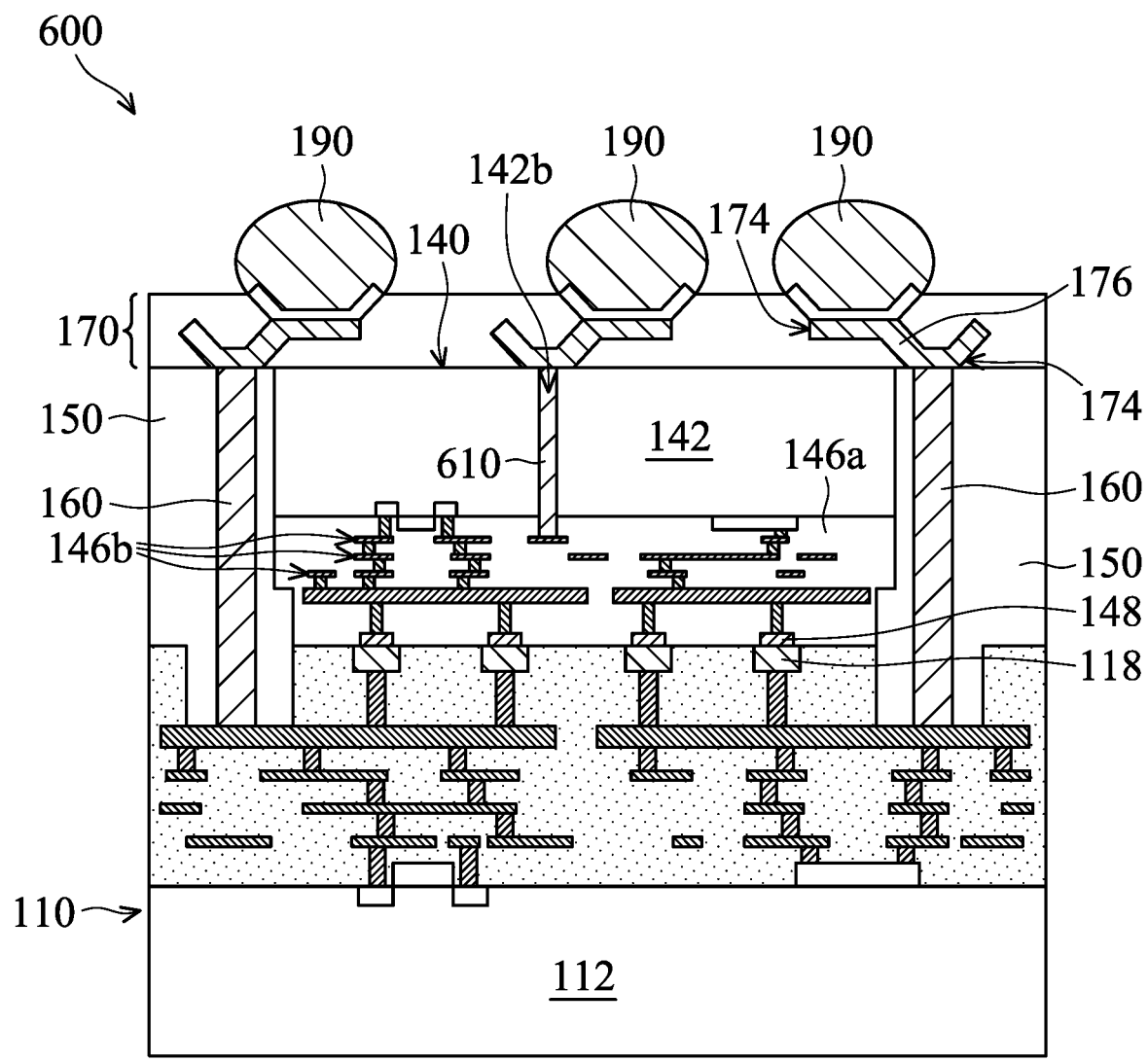
FIG. 6 is a cross-sectional view of a chip package structure 600, in accordance with some embodiments.

FIG. 6 is a cross-sectional view of a chip package structure 600, in accordance with some embodiments. As shown in FIG. 6, the chip package structure 600 is similar to the chip package structure 400 of FIG. 4, except that the chip package structure 600 further includes a conductive via structure 610, in accordance with some embodiments.

The conductive via structure 610 passes through the semiconductor structure 142 and extends into the dielectric layer 146a to be electrically connected to the wiring layers 146b, in accordance with some embodiments. The conductive via structure 610 electrically connects the wiring layers 174 to the wiring layers 146b, in accordance with some embodiments.

The formation of the conductive via structure 610 includes: partially removing the semiconductor structure 142 and the dielectric layer 146a to form a through hole 142b in the semiconductor structure 142 and the dielectric layer 146a before forming the redistribution layer 170, wherein the through hole 142b passes through the semiconductor structure 142 and extends into the dielectric layer 146a; and forming the conductive via structure 610 in the through hole 142b, in accordance with some embodiments. The conductive via structure 610 is made of a conductive material such as metal (e.g., aluminum, copper or tungsten) or alloy, in accordance with some embodiments.

Processes and materials for forming the chip package structure 600 may be similar to, or the same as, those for forming the chip package structures 100 and 400 described above.

Figure 7A:
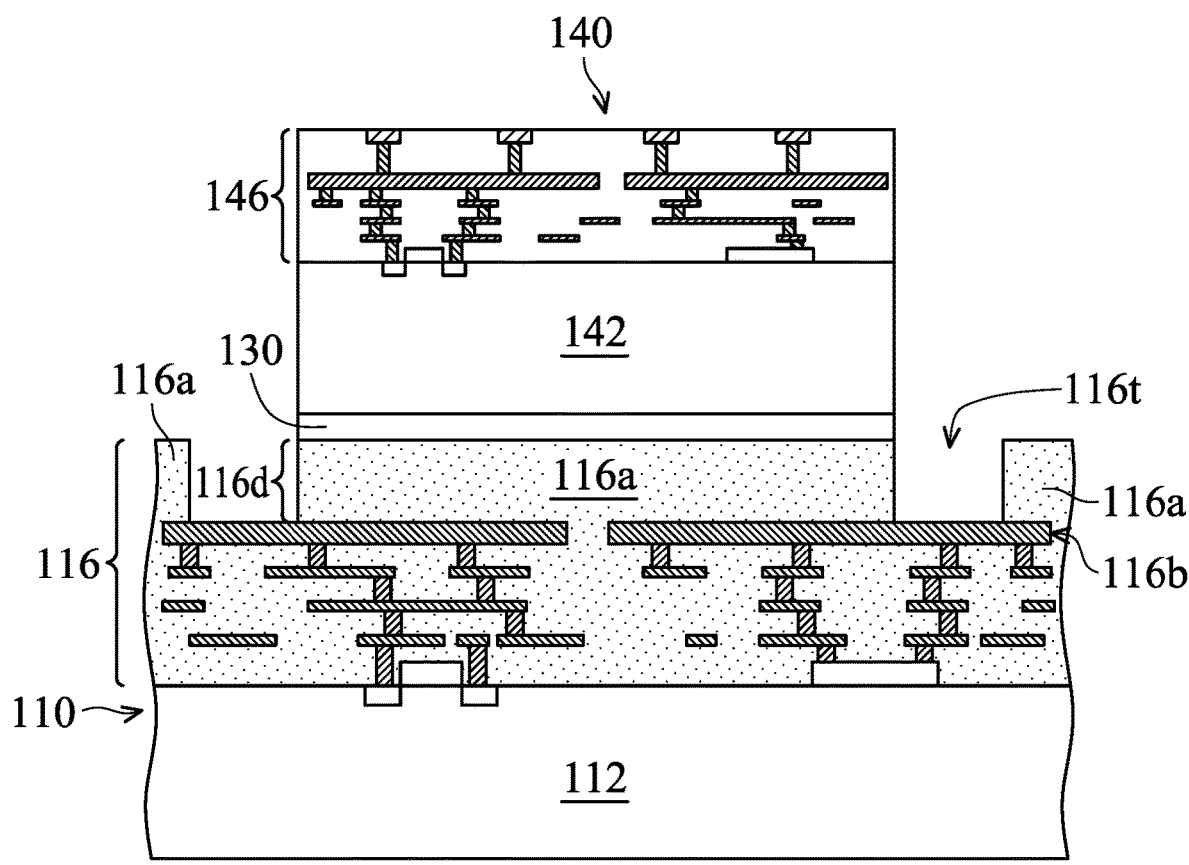
FIGS. 7A-7C are cross-sectional views of various stages of a process for forming a chip package structure, in accordance with some embodiments.
Figure 7B:
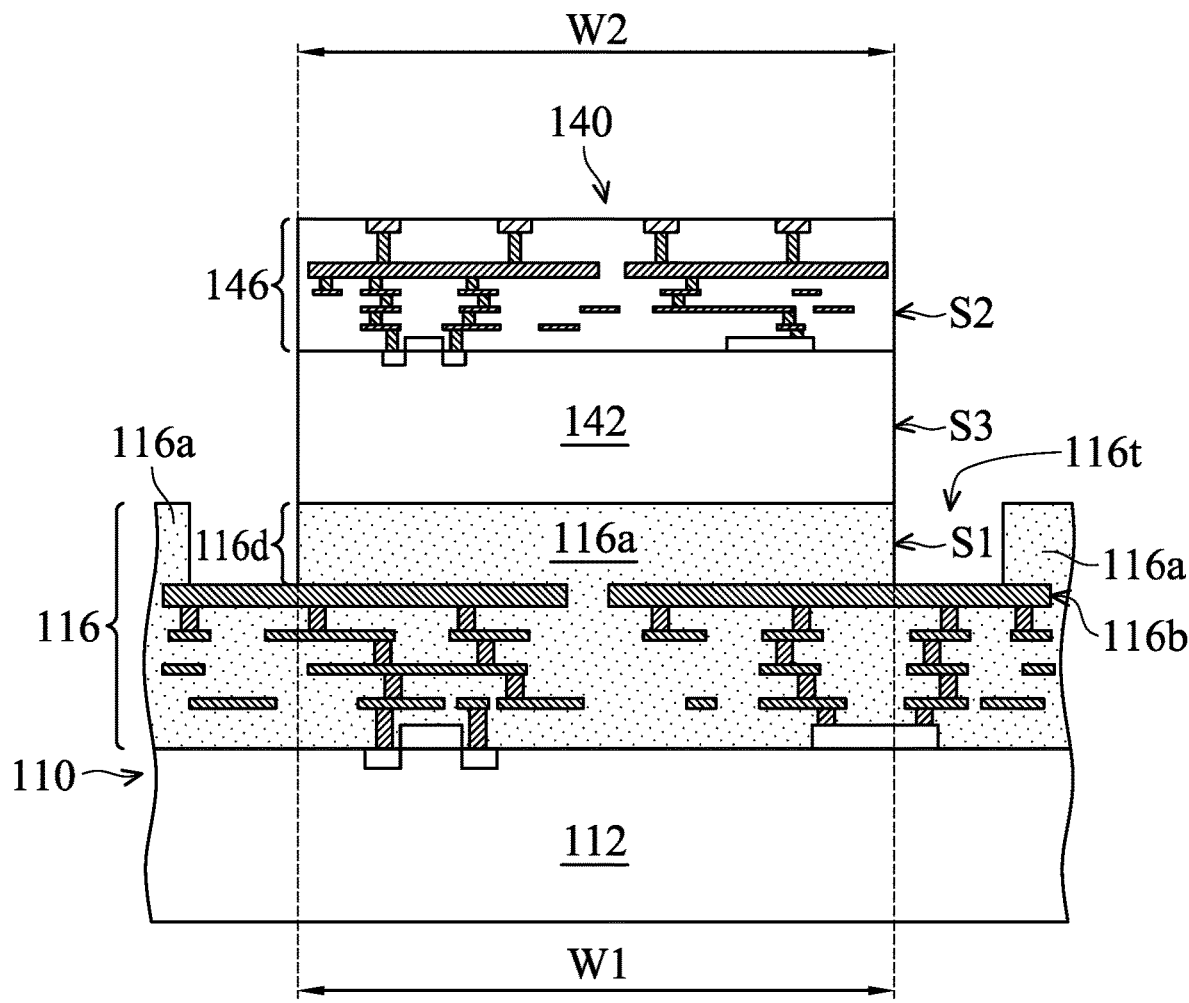
Figure 7C:
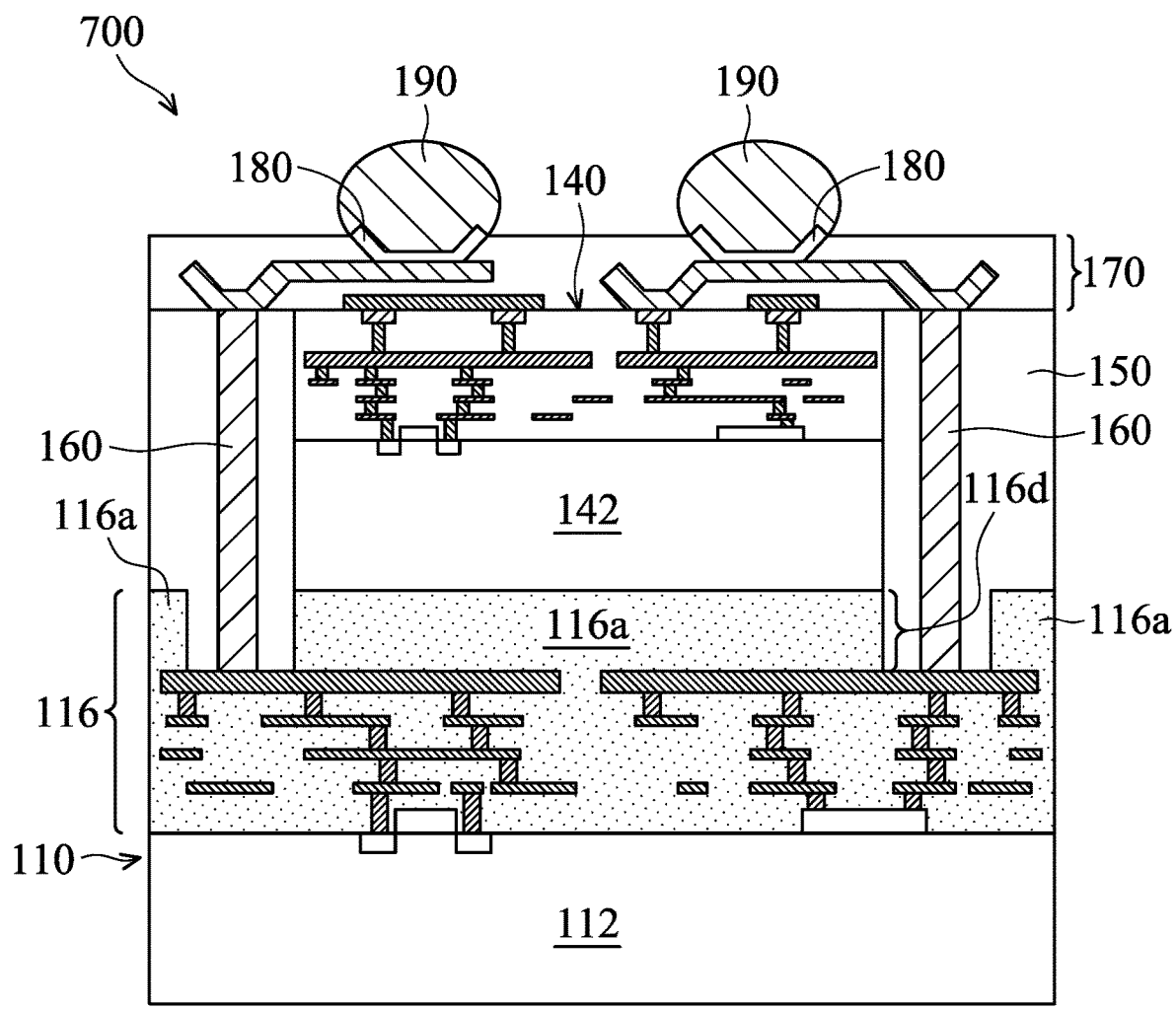

FIGS. 7A-7C are cross-sectional views of various stages of a process for forming a chip package structure, in accordance with some embodiments. As shown in FIG. 7A, after the step of FIG. 1F, the chip structure 140 is disposed on the liquid layer 130, in accordance with some embodiments. The semiconductor structure 142 is between the redistribution layer 146 and the liquid layer 130, in accordance with some embodiments.

As shown in FIG. 7B, the liquid layer 130 is evaporated, in accordance with some embodiments. The chip structure 140 is in direct contact with and bonded to the bonding portion 116d after the liquid layer 130 is evaporated, in accordance with some embodiments. The semiconductor structure 142 is in direct contact with the bonding portion 116d, in accordance with some embodiments.

In some embodiments, the sidewall S1 of the bonding portion 116d and the sidewall S3 of the semiconductor structure 142 are substantially coplanar. In some embodiments, the sidewall S2 of the redistribution layer 146 and the sidewalls S1 and S3 are substantially coplanar. The semiconductor structure 142 has the width W2, which is substantially equal to the width W1 of the bonding portion 116d, in accordance with some embodiments. The semiconductor structure 142 is in direct contact with and bonded to the dielectric layer 116a of the redistribution layer 116, in accordance with some embodiments.

As shown in FIG. 7C, the steps of FIGS. 1I-1M are performed to form chip package structures 700, in accordance with some embodiments. For the sake of simplicity, FIG. 7C only shows one of the chip package structures 700.

Materials for forming the chip package structure 700 may be similar to, or the same as, those for forming the chip package structure 100 described above.

Figure 8:
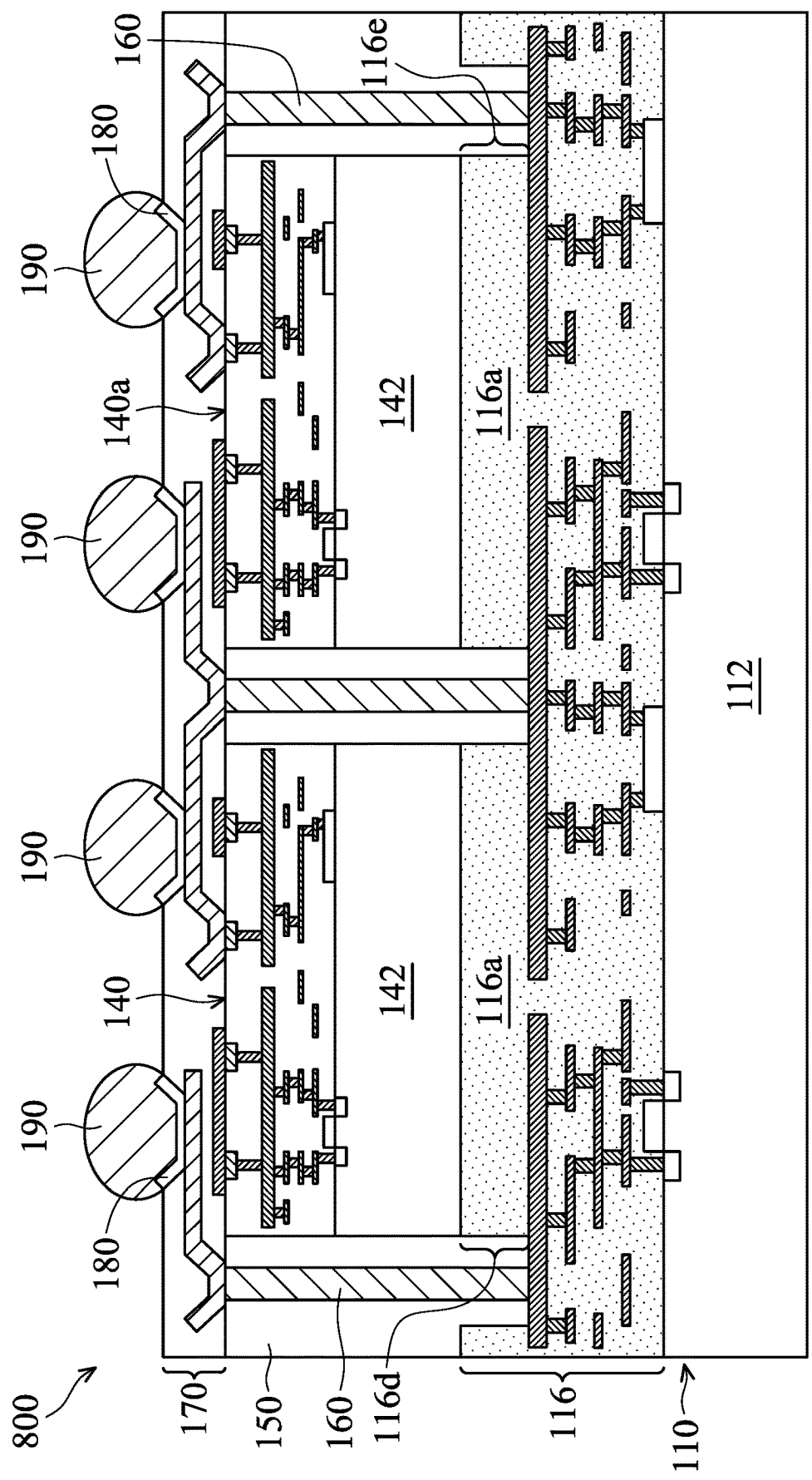
FIG. 8 is a cross-sectional view of a chip package structure 800, in accordance with some embodiments.

FIG. 8 is a cross-sectional view of a chip package structure 800, in accordance with some embodiments. As shown in FIG. 8, the chip package structure 800 is similar to the chip package structure 700 of FIG. 7C, except that the chip package structure 800 further includes a chip structure 140a and a bonding portion 116e of the redistribution layer 116, in accordance with some embodiments.

The chip structure 140a is bonded to the bonding portion 116e, in accordance with some embodiments. The chip structure 140a is the same as or similar to the chip structure 140, in accordance with some embodiments. The bonding portion 116e is the same as or similar to the bonding portion 116d, in accordance with some embodiments.

Processes and materials for forming the chip package structure 800 may be similar to, or the same as, those for forming the chip package structures 100 and 700 described above.

In accordance with some embodiments, chip package structures and methods for forming the same are provided. The methods (for forming the chip package structure) form a liquid layer over a bonding portion of a redistribution layer. The bonding portion is surrounded by an alignment trench. Then, a chip structure is disposed over the liquid layer. The chip structure is self-aligned with the bonding portion by the surface tension of the liquid layer therebetween. As a result, the alignment accuracy between the chip structure and the bonding portion is improved by the liquid layer. Thereafter, the liquid layer is evaporated, and the chip structure is bonded to the bonding portion.

In accordance with some embodiments, a method for forming a chip package structure is provided. The method includes partially removing a first redistribution layer to form an alignment trench in the first redistribution layer. The alignment trench surrounds a bonding portion of the first redistribution layer. The method includes forming a liquid layer over the bonding portion. The method includes disposing a chip structure over the liquid layer, wherein a first width of the bonding portion is substantially equal to a second width of the chip structure. The method includes evaporating the liquid layer. The chip structure is in direct contact with the bonding portion after the liquid layer is evaporated.

In accordance with some embodiments, a method for forming a chip package structure is provided. The method includes partially removing a carrier substrate to form an alignment trench in the carrier substrate. The alignment trench surrounds a bonding portion of the carrier substrate. The method includes forming a liquid layer over the bonding portion. The method includes disposing a chip structure over the liquid layer. The chip structure and the bonding portion have a same shape. The method includes evaporating the liquid layer. The chip structure is bonded to the bonding portion after the liquid layer is evaporated.

In accordance with some embodiments, a chip package structure is provided. The chip package structure includes a first redistribution layer having a bonding portion. The chip package structure includes a chip structure bonded to the bonding portion, wherein a first width of the bonding portion is substantially equal to a second width of the chip structure. The chip package structure includes a protective layer over the first redistribution layer and surrounding the chip structure, wherein a portion of the protective layer extends into the first redistribution layer and surrounds the bonding portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
   partially removing a first redistribution layer to form an alignment trench in the first redistribution layer, wherein the alignment trench surrounds a bonding portion of the first redistribution layer, and the bonding portion comprises a dielectric layer;
   forming a liquid layer over the bonding portion;
   disposing a chip structure over the liquid layer, wherein a first width of the dielectric layer of the bonding portion is substantially equal to a second width of the chip structure; and
   evaporating the liquid layer, wherein the chip structure is bonded to the bonding portion after the liquid layer is evaporated.

2. The method for forming the chip structure package structure as claimed in claim 1, wherein the liquid layer is made of water.

3. The method for forming the chip package structure as claimed in claim 1, further comprising:
   before partially removing the first redistribution layer to form the alignment trench in the first redistribution layer, forming the first redistribution layer over a substrate.

4. The method for forming the chip package structure as claimed in claim 1, wherein a first length of the dielectric layer of the bonding portion is substantially equal to a second length of the chip structure.

5. The method for forming the chip package structure as claimed in claim 1, wherein the chip structure comprises:
   a substrate; and
   a second redistribution layer over the substrate, wherein the second redistribution layer is in direct contact with the bonding portion after the liquid layer is evaporated, and the second redistribution layer has the second width.

6. The method for forming the chip package structure as claimed in claim 1, further comprising:
   forming a protective layer over the first redistribution layer to surround the chip structure after evaporating the liquid layer, wherein the alignment trench is filled with the protective layer.

7. The method for forming the chip package structure as claimed in claim 6, further comprising:
   partially removing the protective layer to form a through hole in the protective layer after forming the protective layer, wherein the through hole passes through the protective layer and extends into the alignment trench; and
   forming a conductive via structure in the through hole.

8. The method for forming the chip package structure as claimed in claim 6, wherein the chip structure comprises:
   a substrate; and
   a second redistribution layer over the substrate, wherein the second redistribution layer is in direct contact with the bonding portion after the liquid layer is evaporated, and the method further comprising:

partially removing the substrate to form a through hole in the substrate after forming the protective layer, wherein the through hole passes through the substrate; and forming a conductive via structure in the through hole, wherein the conductive via structure is electrically connected to the second redistribution layer.

9. The method for forming the chip package structure as claimed in claim 5, wherein the bonding portion comprises a first conductive pad, the second redistribution layer of the chip structure comprises a second conductive pad, the second conductive pad is over the first conductive pad after disposing the chip structure over the liquid layer, and a portion of the liquid layer is between the first conductive pad and the second conductive pad.

10. The method for forming the chip package structure as claimed in claim 9, wherein the first conductive pad is in direct contact with the second conductive pad after evaporating the liquid layer.

11. The method for forming the chip package structure as claimed in claim 1, wherein the chip structure comprises a semiconductor substrate, and the semiconductor substrate has the second width.

12. A method for forming a chip package structure, comprising:

partially removing a carrier substrate to form an alignment trench in the carrier substrate, wherein the alignment trench surrounds a bonding portion of the carrier substrate, and a trench width of the alignment trench is less than a first width of the bonding portion;

forming a liquid layer over the bonding portion;

disposing a chip structure over the liquid layer, wherein the chip structure and the bonding portion have a same shape; and evaporating the liquid layer, wherein the chip structure is bonded to the bonding portion after the liquid layer is evaporated.

13. The method for forming the chip package structure as claimed in claim 12, wherein the first width of the bonding portion is substantially equal to a second width of the chip structure.

14. The method for forming the chip package structure as claimed in claim 13, wherein a first length of the bonding portion is substantially equal to a second length of the chip structure.

15. The method for forming the chip package structure as claimed in claim 12, further comprising:

forming a protective layer over the carrier substrate to surround the chip structure after evaporating the liquid layer, wherein the alignment trench is filled with the protective layer.

16. A method for forming a chip package structure, comprising:

partially removing a first redistribution layer to form an alignment trench in the first redistribution layer, wherein the alignment trench surrounds a bonding portion of the first redistribution layer;

forming a liquid layer over the bonding portion;

disposing a chip structure over the liquid layer, wherein the chip structure comprises a semiconductor substrate; and evaporating the liquid layer, wherein the chip structure is bonded to the bonding portion, and an inner wall of the alignment trench and a sidewall of the semiconductor substrate are substantially level with each other after the liquid layer is evaporated.

17. The method for forming the chip package structure as claimed in claim 16, wherein the liquid layer is in direct contact with the chip structure and the bonding portion after disposing the chip structure over the liquid layer and before evaporating the liquid layer.

18. The method for forming the chip package structure as claimed in claim 17, wherein the liquid layer is made of water.

19. The method for forming the chip package structure as claimed in claim 16, wherein the chip structure and the bonding portion have a substantially rectangular shape.

20. The method for forming the chip package structure as claimed in claim 16, wherein a first width of the bonding portion is substantially equal to a second width of the chip structure.

* * * * *